(12) United States Patent
Ballandras et al.

(10) Patent No.: US 9,843,304 B2
(45) Date of Patent: Dec. 12, 2017

(54) TRANSDUCER WITH BULK WAVES SURFACE-GUIDED BY SYNCHRONOUS EXCITATION STRUCTURES

(71) Applicants: CENTRE NATIONAL DE LA RECHERCHE SCIENTIFIQUE (C.N.R.S.), Paris (FR); UNIVERSITE DE FRANCHE-COMTE, Besancon (FR)

(72) Inventors: Sylvain Ballandras, Besancon (FR); Viktor Plesski, Bevaix (CH)

(*) Notice: Subject to any disclaimer, the term of this patent is extended or adjusted under 35 U.S.C. 154(b) by 315 days.

(21) Appl. No.: 14/436,455

(22) PCT Filed: Oct. 9, 2013

(86) PCT No.: PCT/EP2013/071050
§ 371 (c)(1),
(2) Date: Apr. 16, 2015

(87) PCT Pub. No.: WO2014/060263
PCT Pub. Date: Apr. 24, 2014

(65) Prior Publication Data
US 2015/0303895 A1    Oct. 22, 2015

(30) Foreign Application Priority Data
Oct. 19, 2012   (FR) ..................... 12 60005

(51) Int. Cl.
*H03H 9/17*    (2006.01)
*H03H 9/19*    (2006.01)
(Continued)

(52) U.S. Cl.
CPC ............. *H03H 9/19* (2013.01); *H01L 41/047* (2013.01); *H01L 41/107* (2013.01);
(Continued)

(58) Field of Classification Search
CPC .. H03H 9/19; H03H 9/02; H03H 9/15; H03H 9/17; H03H 9/25; H01L 41/047; H01L 41/107
(Continued)

(56) References Cited

U.S. PATENT DOCUMENTS 8,512,800 B2 * 8/2013 Godshalk ........... H03H 9/02055
333/189

FOREIGN PATENT DOCUMENTS

DE  10 2007 012383 A1  9/2008
FR       2938136 A1    5/2010

* cited by examiner

*Primary Examiner* — Thomas Dougherty
*Assistant Examiner* — Karen B Addison
(74) *Attorney, Agent, or Firm* — Knobbe Martens Olson & Bear LLP

(57) ABSTRACT

A surface-guided bulk wave transducer includes a stack of an acoustic substrate, an electric ground plane, and a network of synchronous acoustic excitation sources with two combs of elementary piezoelectric transducers alternately interlaced two-by-two according to a periodic network step corresponding to a propagation mode of a surface-guided bulk wave of the acoustic substrate. Each elementary piezoelectric transducer includes a single and different rod with a parallelepipedal shape for which the nature, the cut of the piezoelectric material, the height h, and the width are selected for increasing the electromechanical coupling coefficient of the transducer assembly to a high level.

13 Claims, 8 Drawing Sheets

(51) Int. Cl.
 *H01L 41/047* (2006.01)
 *H01L 41/107* (2006.01)
 *H03H 9/25* (2006.01)
 *H03H 9/02* (2006.01)

(52) U.S. Cl.
 CPC ........ *H03H 9/02228* (2013.01); *H03H 9/171* (2013.01); *H03H 9/25* (2013.01)

(58) Field of Classification Search
 USPC .... 310/313 R, 313 B, 313 D, 320, 357, 359, 310/313 A, 358, 311, 318, 319, 321, 322, 310/323.01, 334
 See application file for complete search history.

TRANSDUCER WITH BULK WAVES SURFACE-GUIDED BY SYNCHRONOUS EXCITATION STRUCTURES

CROSS-REFERENCE TO RELATED APPLICATIONS

This application is the U.S. National Phase under 35. U.S.C. §371 of International Application PCT/EP2013/071050, filed Oct. 9, 2013, which claims priority to French Patent Application No. 12 60005, filed Oct. 19, 2012. The disclosures of the above-described applications are hereby incorporated by reference in their entirety.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

Field of the Invention

The present invention relates to a transducer with bulk waves surface-guided by synchronous excitation structures of the guided elastic wave.

DESCRIPTION OF RELATED ART

In micro-acoustics, particularly in the field of elastic surface wave devices (SAW for surface acoustic wave) and thin film bulk wave resonators (FBARs for Film Bulk Acoustic Resonators), different piezoelectric materials may be used, but in practice the selection is generally limited by the need for reducing losses, for having high electromechanical coupling (which conditions the frequency band width which may be attained for filter applications), for having a proven technological feasibility and especially, in the case of FBARs, compatible with the use of silicon wafers of "microelectronic" quality with a large diameter (a minimum of 4 inches, or even 6, 8 inches and even more, one inch being equal to 25.4 mm in units of the International System), the latter structures being industrially made on this type of substrate.

Finally, only a few types of materials fit these requirements such as quartz, lithium niobate and lithium tantalate for surface wave devices SAW, aluminium nitride (AlN) or zinc oxide (ZnO) in thin films for the devices of the FBAR type, and may actually be applied for industrial applications.

Certain crystals known for their acoustic quality such as sapphire, carbon-diamond, YAG (yttrium-aluminium-garnet) not being piezoelectric, it is very difficult to utilize them for notably improving the intrinsic qualities of acousto-electric passive components. Their utilization for this type of application almost systematically requires a deposited piezoelectric layer allowing excitation and detection of elastic waves.

Other materials such as silicon already mentioned above and its derivatives (SiGe), or semi-conducting materials, have also to be considered here as vital elements with which the acousto-electric passive elements have to be associated in order to provide integrated functions still inaccessible by digital synthesis. These functions are for example radiofrequency filtering and synthesis of direct frequency band reference signals, particularly at radiofrequencies (S-band, C-band, X-band for example).

In addition, compatibility of such materials is a critical economic issue for developing the solutions described here. Except for a few examples (GaN), these semi-conducting materials do not have significant piezoelectric properties and even in most cases, are entirely lacking these.

Different <<laminated structures>> based on the stacking of layers have thus been proposed for combining the advantages of the substrates mentioned above (for example the very high propagation velocities of elastic waves in diamond or the very low acoustic losses of sapphire) and of piezoelectric properties capable of meeting the requirements specification of modern RF filters and sources.

The most effective, i.e. those having given rise to successful industrial utilization, are based on the use of aluminium nitride (AlN) which fits a large number of the criteria listed above. Efforts made over the past 20 years for ensuring industrial control of the physical properties of this material have paved the way for novel principles for transducers, resonators and structures for excitation and guidance of surface or bulk elastic waves.

A conventional transducer, the structure of which is based on these novel principles, conventionally comprises an acoustic, non-piezoelectric substrate and with high acoustic quality, i.e. having a high phase velocity and low intrinsic losses, a solid and uniform piezoelectric layer entirely deposited above the acoustic substrate, excitation transduction electrodes in the form of inter-digitated combs deposited on the piezoelectric layer of surface elastic waves. Other embodiments have been proposed, for example with a solid metal layer between the acoustic substrate and the piezoelectric layer in order to attempt to improve the physical characteristics of the generated modes. This structure is designated with the acronym STFM (substrate-metal-film-transducer).

Nevertheless, for applications to guided surface wave components, the corresponding electromechanical coupling coefficient obtained remains quite modest. It is three to five times greater than that of crystalline silicon dioxide ($SiO_2$—quartz) at most by considering the surface waves on this latter material, longitudinal bulk waves along the axis C of the material themselves being 15 times better coupled than the surface waves for aluminium nitride. This characteristic is varied for structures of metal transducers with interlaced or inter-digitated fingers deposited at the surface of the piezoelectric film, comparable with those made on a conventional piezoelectric substrate in a material such as quartz, lithium niobate ($LiNbO_3$), and lithium tantalate ($LiTaO_3$).

One of the reasons which allows an explanation of this factual situation relates on the one hand to the deployment of the electrostatic field lines in the film, the piezoelectric excitation drive, which do not allow making the most of the colinear coupling to the C axis (the "drive" of the longitudinal mode usually utilized for FBARs), on the one hand and the nature of the surface wave displacements, mainly guided by the substrate which thus carries the main portion of the generated acousto-electric energy on the other hand. Finally, the actual principle of the excitation with inter-digitated combs partly causes a destructive combination of the partial modes making up the wave.

BRIEF SUMMARY OF THE INVENTION

The invention shown here proposes to find a remedy to the drawbacks above and to improve the electromechanical coupling coefficient of guided surface wave components as described above.

For this purpose, the object of the invention is a surface-guided bulk wave transducer, intended to operate at an acoustic surface wavelength $\lambda$ and to convert an electric signal at an operating frequency ft corresponding to the acoustic wavelength $\lambda$ into a surface-guided bulk wave and vice versa, comprising an acoustic substrate and an electric ground plane, the acoustic substrate being made as a plate forming a first layer in a first insulated, single crystal or polycrystalline material cut according to three planes of a first crystalline cut defined according to the nomenclature (YXwlt)/$\phi$/$\theta$/$\psi$ of the IEEE Std-176 standard (1949 revision) by a first angle $\phi$, a second angle $\theta$, and a third angle $\psi$, the substrate plate being extended along a first thickness t1, a first length l1 and a first width w1, the plate of the acoustic substrate having a first rest face and facing in the direction of the first thickness t1, an opposite second supporting face having a roughness condition, the crystalline cut of the first material being selected and the roughness condition of the second face being sufficiently smooth so as to allow propagation of Rayleigh, Bleustein-Gulyaev elastic waves or pseudo-surface waves (PSAW) in the direction of the first length l1 of the acoustic substrate, the ground plane being made as a second layer in a second electrically conducting material, deposited on the acoustic substrate on the side of its second face, the second layer being extended along a second uniform thickness t2, a second width w2, and a second length l2, the second layer having a third face, positioned facing the second face of the acoustic substrate, and having a fourth opposite face and facing the third face in the direction of the second thickness t2, the directions of the second thickness e2, the second width w2, the second length l2 respectively being the same as the directions of the first thickness e1, the first width w1, the second length l2;

characterized in that the surface guided bulk wave transducer comprises a network of synchronous acoustic excitation sources, configured so as to be mechanically and electrically connected to a synchronous excitation electric source, deposited on the ground plane, and including a first comb of one or several elementary piezoelectric transducers arranged along a first direction and a second comb of one or several elementary piezoelectric transducers in the same number as those of the first comb arranged along a second direction opposite to the first so that the elementary piezoelectric transducers of the first comb and of the second comb are alternately interlaced two-by-two according to a periodic step p of the network and along the propagation direction of the elastic surface waves along the second supporting face in the direction of the first length l1 of the acoustic substrate, double the step of the network 2p being substantially equal to the acoustic wavelength $\lambda$;

each elementary transducer includes a single and different rod and a single and different electric excitation upper metal electrode, the rod being made in a third single crystal or polycrystalline piezoelectric material cut along three planes of a second crystalline cut defined according to the nomenclature (YXwlt)/$\phi$/$\theta$/$\psi$ of the IEEE Std-176 standard (1949 revision) by a second angle $\phi$2, a second angle $\theta$2, and a third angle $\psi$2, having a same profiled shape with a rectangular or trapezoidal section, having a fifth face facing the face of the ground plane, a sixth face opposite to the fifth face on which is deposited the associated excitation electrode, and two lateral flanks connecting on both sides the fifth face and the sixth face, and defined by a third thickness h as being the height separating the fifth face and the sixth face, a third width d covering the ground plane and a third length L;

the third material and the second cut being selected so as to allow propagation of bulk elastic waves in the direction of the third thickness h with a high coupling coefficient at least greater than or equal to 0.1%, and the third thickness h is comprised between one quarter and three quarters of the wavelength $\lambda_{bulk}$ of the bulk elastic mode propagating within the third material in the direction of the third thickness and corresponding to the operating frequency ft;

the third width d being strictly smaller than half the acoustic wavelength and of a same orientation as the propagation direction of surface-guided bulk waves of the acoustic substrate;

two adjacent elementary transducers being separated from each other in the direction of their third width with a separation space of non-zero separation length D, the sum of the third width d and of the separation length D being equal to the step p of the network, and the second material is acoustically pervious to elastic waves generated by piezoelectricity.

According to particular embodiments, the transducer includes one or more of the following features:

the first comb and the second comb each comprise a number of elementary transducers greater than two, preferably greater than 5;

the second crystallographic cut of the second material is selected so as to allow piezoelectric excitation of elastic bulk waves propagating in each elementary transducer in the direction of the third thickness, these waves either being essentially longitudinal deformation waves, or essentially transverse deformation waves;

the third thickness h of each elementary transducer is comprised either between 0.9 times $\lambda_{bulk}/2$ and 1.1 times $\lambda_{bulk}/2$ or between 0.9 times $\lambda_{bulk}/4$ and 1.1 times $\lambda_{bulk}/4$, and adjusted so that a maximum resonance level is attained in each of the elementary transducers;

the first material is comprised in the set formed by sapphire, diamond, silicon, YAG (yttrium-aluminium-garnet, so-called aluminous garnets) and other compounds based on garnet (iron-containing or chromium-containing garnets), fused quartz, crystalline quartz, lithium niobate, lithium tantalate, langasite and its variants notably langanite and langatate, as well as gallium orthophosphate, the second material is comprised in the set formed by the metals Al, Mo, Pt, W, Cu, Ni, Au, Ag and the alloys AlCu, AlTi, AlSi, and Ti/Pt, Ta/Pt, and the third material is comprised in the set formed by aluminium nitride, aluminium nitride doped with scandium, zinc oxide, PZT, lithium niobate, lithium tantalate, crystalline quartz, langasite and its variants, gallium orthophosphate, potassium niobate and relaxers of the PMN-PT type and other variants of this nature;

the first material of the acoustic substrate is preferably amorphous or crystallized quartz, langasite and its variants, notably langanite and langatate, gallium orthophosphate, lithium tetraborate, potassium niobate, lithium tantalate so as to compensate for the temperature drift effects observed for bulk waves generated by the elementary transducers and for those with transverse polarization in the direction of the third length L;

the length L of each elementary transducer is greater than ten times the acoustic wavelength λ of the surface-guided bulk waves of the acoustic substrate;

the repetition step p of the transducers is adjusted according to a characteristic surface wavelength of an elastic surface wave of the family comprising Rayleigh waves, Bleustein-Gulyaev waves, STW waves, Sezawa waves in order to allow effective excitation of the surface waves on an external surface area located outside and in the extension of the region of the network of the elementary transducers;

either the ground plane, located between the adjacent elementary transducers is exposed, or a third material layer, the thickness of which is less than one quarter of the third thickness h is deposited between the adjacent elementary transducers;

each elementary piezoelectric transducer comprises a layer of an acoustic material for compensating the frequency shift effects of temperature, interposed either between the piezoelectric rod and the ground plane, or between the piezoelectric rod and the associated excitation upper electrode, the temperature compensation material may for example be amorphous silica;

the rods have a same profiled shape with a trapezoidal section, and in which, for each rod, the clearance angle formed between the normal of the fifth face and a transverse direction oriented in the same direction as the normal is less than 30°.

The object of the invention is also a method for manufacturing a surface-guided bulk wave transducer, intended to operate at an acoustic wavelength λ and to convert an electric signal at a frequency corresponding to the acoustic wavelength λ into a surface-guided bulk wave and vice versa, comprising the steps:

in one step, an acoustic substrate is made as a plate forming a first layer in a first electrically insulating, single crystal or polycrystalline material cut along three planes of a first crystalline cut defined according to the nomenclature (YXwlt)/ϕ/θ/ψ of the IEEE Std-176 standard (1949 revision) by a first angle ϕ, a second angle θ, and a third angle ψ, the plate being extended along a first thickness t1, a first length l1 and a first width w1, the plate of the acoustic substrate having a first rest face and facing it, in the direction of the first thickness t1, a second opposite supporting face having a roughness condition, the crystalline cut of the first material being selected and the roughness condition of the second face being sufficiently smooth in order to allow propagation of elastic Rayleigh or Bleustein-Gulyaev waves or pseudo surface waves (PSAW) in the direction of the first length l1 of the acoustic substrate, and in a following step, a ground plane is made as a second layer in a second electrically conducting material, deposited on the acoustic substrate on the side of its second face, the second layer being extended along a second uniform thickness t2, a second width w2, and a second length l2, the second layer having a third face, positioned facing the second face of the acoustic substrate, and having a fourth opposite face and facing the third face in the direction of the second thickness t2, the directions of the second thickness e2, the second width w2, the second length l2 respectively being the same as the directions of the first thickness e1, the first width w1, the second length l2, and the second material being acoustically pervious to elastic waves generated by piezoelectricity;

characterized in that the method further comprises a step consisting in that in a following step, a network of synchronous acoustic excitation sources is produced by being positioned on the ground plane, the network being configured so as to be mechanically and electrically connected to a synchronous excitation electric source, and including a first comb of one or several elementary piezoelectric transducers arranged along a first direction and a second comb of one or several elementary piezoelectric transducers in the same number as those of the first comb arranged along a second direction opposite to the first so that the elementary piezoelectric transducers of the first comb and of the second comb are alternately interlaced two-by-two according to a periodic network step p and along the propagation direction of the elastic surface waves along the second supporting face in the direction of the first length l1 of the acoustic substrate, double the step of the network 2p being substantially equal to the acoustic wavelength λ;

each elementary transducer including a single and different rod and a single and different excitation upper metal electrode, the rod being made in a third single crystal or polycrystalline piezoelectric material, cut along three planes of a second crystalline cut defined according to the nomenclature (YXwlt)/ϕ/θ/ψ of the IEEE Std-176 standard (1949 revision) by a second angle ϕ2, a second angle θ2, and a third angle ψ2, having a same profiled shape with a rectangular or trapezoidal section, having a fifth face facing the face of the ground plane, a sixth face opposite to the fifth face on which is deposited the associated excitation electrode, and two lateral flanks connecting on both sides the fifth face and the sixth face, and defined by a third thickness h like the height separating the fifth face and the sixth face, a third width d covering the ground plane and a third length L;

the third material and the second cut being selected so as to allow propagation of bulk elastic waves in the direction of the third thickness h with a high coupling coefficient at least greater than or equal to 0.1%, and the third thickness h being comprised between one quarter and three quarters of the wavelength $\lambda_{bulk}$ of the bulk elastic mode propagating within the third material in the direction of the third thickness and corresponding to the operating frequency ft;

the third width d being strictly smaller than half of the acoustic wavelength and with a same orientation as the propagation direction of the surface-guided bulk waves of the acoustic substrate;

two adjacent elementary transducers being separated from each other in the direction of their third width by a separation space with a non-zero separation length D, the sum of the third width d and of the separation length D being equal to the step p of the network.

The object of the invention is also a transducer, synchronously excited and utilizing surface-guided bulk waves having a predetermined acoustic wavelength, comprising a transducer as defined above, and a differential voltage source having a first output terminal and a second output terminal, for which the applied voltage polarities are opposite to each other, the first output terminal being connected to the first comb and the second output terminal being connected to the second comb.

BRIEF DESCRIPTION OF THE SEVERAL VIEWS OF THE DRAWINGS

The invention will be better understood upon reading the description of several embodiments which follows, only given as an example and made with reference to the drawings wherein.

DETAILED DESCRIPTION OF THE INVENTION

Figure 1:
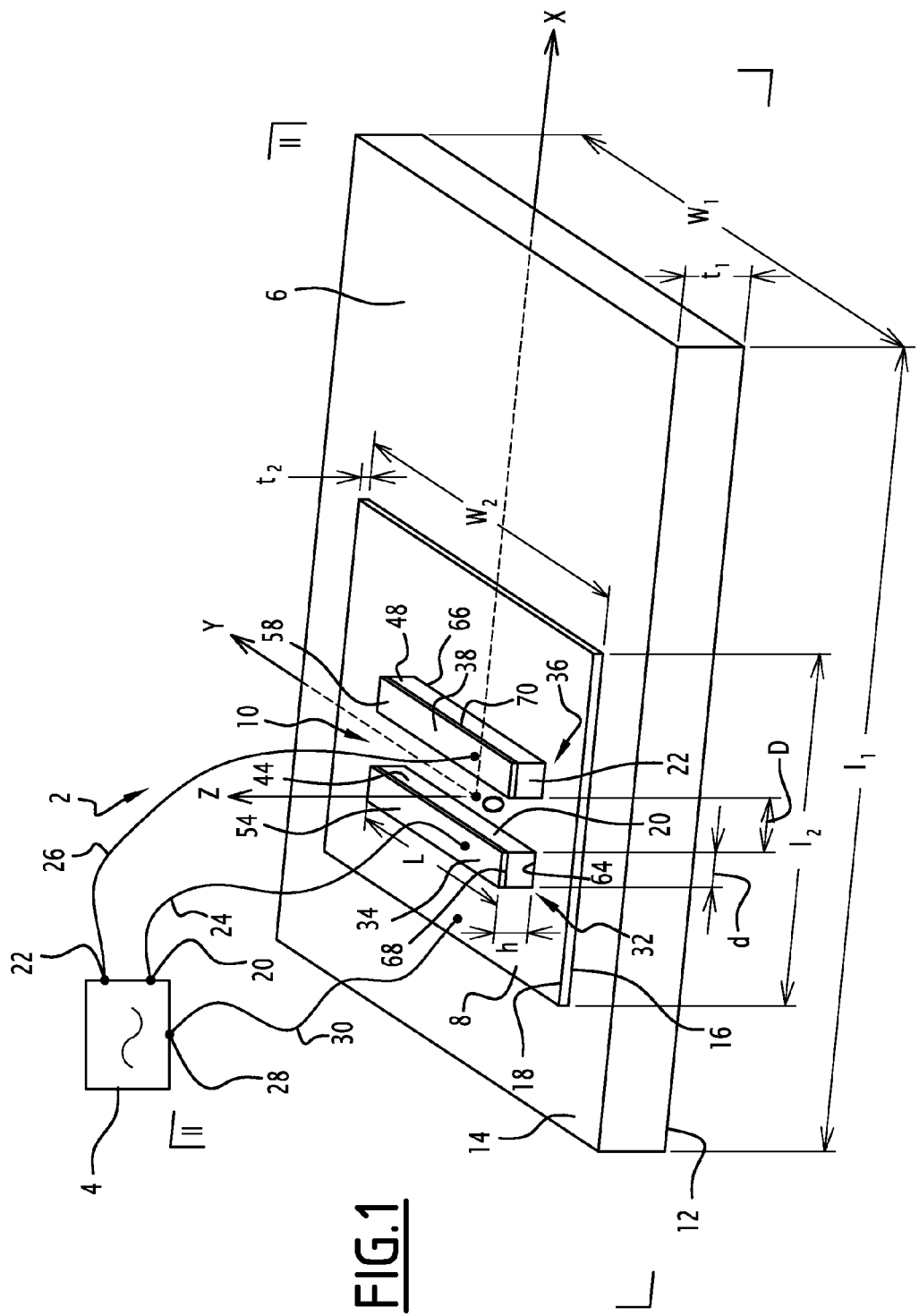
FIG. 1 is a perspective view of the structure of a first embodiment of a surface-guided bulk wave transducer according to the invention.

According to FIG. 1 and to a first embodiment, an electro-acoustic transducer 2 with surface-guided bulk elastic waves, intended to operate at a predetermined acoustic surface wavelength λ and to convert an electric signal at an operating frequency ft corresponding to the acoustic wavelength λ into a surface-guided bulk wave of the transducer of the substrate and vice versa, is connected to an electric source 4 which is configured in order to operate for example as a general electric excitation external source.

Alternatively, the electric source 4 is configured so as to operate like an electric receiver and both as an electric excitation source and an electric receiver.

The electro-acoustic transducer 2 comprises an acoustic substrate 6, an electric ground plane 8, and a network 10 of electro-acoustic elementary transducers with synchronous acoustic excitation.

The acoustic substrate 6 is made as a plate forming a first layer in a first single crystal or polycrystalline electrically insulating material, cut along three planes of a first crystalline cut defined according to the nomenclature (YXwlt)/ϕ/θ/ψ of IEEE Std-176 standard (IRE-1949 revision) by a first angle ϕ1, a second angle θ1, and a third angle ψ1.

The acoustic plate 6 with a parallelepipedal shape is extending along a first thickness t1, a first length l1 and a first width w1. The plate 6 has a first rest face 12 and facing it in the direction of the first thickness t1, a second opposite supporting face 14 having a roughness condition, the crystalline cut of the first material being selected and the roughness condition of the second face being sufficiently smooth for allowing propagation of elastic Rayleigh or Bleustein-Gulyaev waves or pseudo surface waves (PSAW) in the direction of the first length l1 of the acoustic substrate 6.

The electric ground plane 8 is made as a second layer of a second electrically conducting material. The second layer is deposited on the acoustic substrate 6 on the side of it second face 14. The second layer 8 is extended along a second uniform thickness t2, a second width w2, and a second length l2. The second layer 8 has a third face 16, positioned facing the second face 14 of the acoustic substrate 6, and has a fourth face 18, opposite and facing the third face 16 in the direction of the second thickness t2, the directions of the second thickness e2, the second width w2, the second length l2 respectively being the same as the directions of the first thickness e1, the first width w1, the second length l2.

The network 10 of elementary transducers for synchronous acoustic excitation and acoustic guiding of bulk and surface waves is here mechanically and electrically connected to the synchronous excitation electric source 4 in a first input terminal 20 and a second input terminal 22 with opposite polarities through a first conducting wire 24 and a second corresponding conducting wire 26. The ground plane 8 is here mechanically and electrically connected to the electric excitation source 4 at a third input terminal 28 for setting to an electric common ground at the input 22 through a third conducting wire 30.

It should be noted that when the voltage excitation electric source 4 is a differential source, it is not necessary to connect the ground plane 8 to the ground of the electric excitation source 4.

Figure 2:
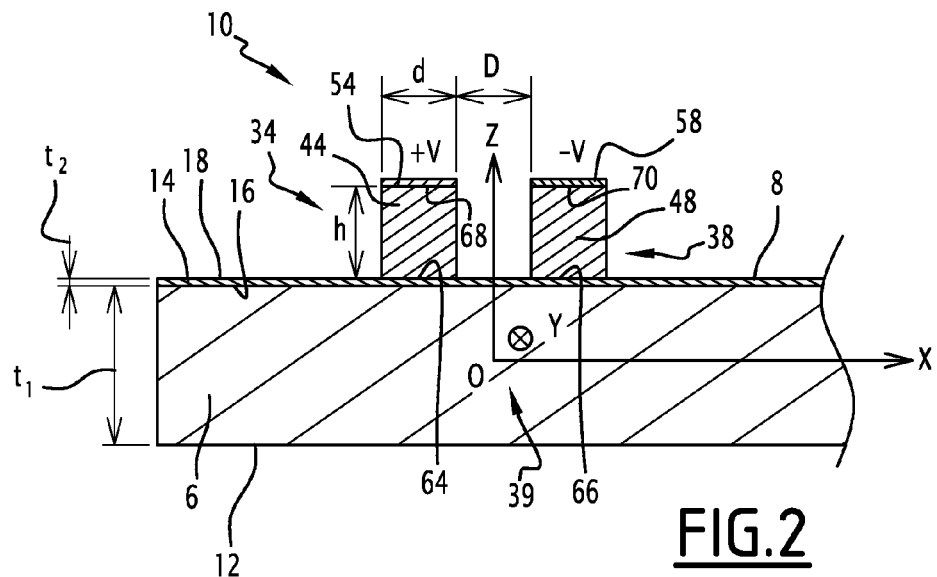
FIG. 2 is a section of the transducer described in FIG. 1 along the sectional plane II-II.

According to FIGS. 1 and 2, the network 10 includes a first comb 32, here formed with a single elementary piezoelectric transducer 34 laid out along a first direction, and a second comb 36, here formed with a single elementary piezoelectric transducer 38, with the same shape as the elementary piezoelectric transducer 34 of the first comb 32.

The elementary piezoelectric transducer 38 of the second comb 34 is laid out along a second direction opposite to the first so that the elementary piezoelectric transducers 34, 38 of the first comb 32 and of the second comb 36 are alternately interlaced two-by-two according to a periodic step p of the network and along the propagation direction of the acoustic surface waves along the second supporting face 14 in the direction of the first length l1 of the acoustic substrate 6 represented by the direction of an axis X from left to right in FIGS. 1 and 2, the axis X forming the first axis of a reference system 39.

The reference system 39 comprises a point of origin designated by O, the first axis X, a second axis Y and a third axis Z.

The origin O is a point of the acoustic substrate 6 located below the second face 14 in a middle plane located at half the distance between both piezoelectric transducers 32, 36.

The third axis Z is the axis passing through O oriented along the normal of the second face 14 of the acoustic substrate 6, and defines with a first axis X the sagittal plane of FIG. 2, i.e. the section II-II plane of FIG. 1.

The second axis Y is the axis of the reference system 39 which makes the (X, Y, Z) trihedron direct. Crossing the point O, it is illustrated upright in FIG. 2 while escaping to the rear.

The network step p is substantially equal to half the acoustic wavelength $\lambda$ of the surface-guided bulk wave along the acoustic substrate or, equivalently, double the network step $2p$ is substantially equal to the acoustic wavelength $\lambda$ of the surface-guided bulk wave of the acoustic substrate.

Each elementary transducer 34, 38 includes a single and different rod 44, 48 and a single and different electric excitation upper metal electrode 54, 58.

Each rod 44, 48 is made in a third piezoelectric material either single crystal or polycrystalline, cut along three planes of a second crystalline cut defined according to the nomenclature (YXwlt)/$\phi$/$\theta$/$\psi$ of the IEEE Std-176 standard (IRE-1949 revision) by a second angle $\phi2$, a second angle $\theta2$, and a third angle $\psi2$.

Each rod 44, 48 has a same parallelepipedal shape defined by a third thickness h, a third width d, and a third length L, and respectively has a fifth face 64, 66 facing the face 18 of the ground plane 8 and a sixth face 68, 70, opposite to the fifth face 64, 66, on which is deposited the associated excitation upper electrode 54, 58.

The third material and the second section are selected so as to allow propagation of acoustic bulk waves in the direction of the third thickness h with a high electromechanical coupling coefficient at least greater than or equal to 0.1%.

In practice, the minimum electromechanical coupling coefficient depends on the application.

Thus, the minimum value of the electromechanical coefficient is equal to 5% in the case of applications to filters, is comprised between 0.1 and 1% in the case of applications to resonators for a stable frequency source with high spectral purity. In the case of applications to sensors, this minimum value may be defined between 0.1% and several tens of percent depending on the nature of the materials applied and on the targeted application.

In practice, the attainable electromechanical coupling coefficient depends on the applied material. For aluminium nitride (AlN) and zinc oxide (ZnO) in a longitudinal mode along the crystallographic axis, a so-called C axis (also-called optical axis), a generally recognized value is a minimum of 5%, which may attain 8% for the latter. For lithium niobate as a transfer, thinned and then machined material in order to have the sought structure, the coupling is comprised between 15 and 20% for cuts in the vicinity of the orientation (YX/)/36° (longitudinal mode) and greater than 40% for cuts close to the orientations (XY), (XZ) and (YX)/165° (thickness shear mode).

The same third thickness h of each rod 44, 48 is comprised between one quarter and three quarters of the wavelength $\lambda_{bulk}$ of the elastic bulk mode propagating within the third material in the direction of the third thickness h and corresponding to the operating frequency ft.

The third width d is strictly less than half of the acoustic surface wavelength, the surface wavelength being more globally less than the wavelength of the surface skimming bulk wave (SSBW) of a smaller velocity along the same propagation direction. It has the same orientation as the propagation direction of surface-guided bulk waves of the acoustic substrate 6.

The acceptable acoustic surface wavelength is related to the physical properties of the substrate and the acceptable acoustic surface wave may be forced by excitation of the network of elementary bulk transducers to potentially greater propagation velocities than that of the "natural" wave of the surface (i.e. the natural surface wave in which the surface of the substrate is free) if and only if this wavelength does not correspond to the disconnecting from the mode for which guiding by the surface becomes partial.

In all the following, the term of <<acoustic surface wave>> will globally designate a <<natural>> surface wave or a surface wave <<forced>> by the excitation network and for which the wavelength is less than the wavelength of the surface skimming bulk wave (SSBW) of smaller velocity depending on the propagation direction.

Both acoustic excitation elementary transducers 32, 36 are adjacent, arranged side by side in the direction of the length l1 of the substrate, and separated from each other in the direction of their third width d for a separation space of a non-zero separation length D, the sum of the third width d and of the separation length D being equal to the step p of the network 10.

The second electrically conducting material of the ground plane 8 is acoustically pervious to elastic waves generated by piezoelectricity by both acoustic excitation elementary transducers 34, 38.

Thus, in the structure proposed in FIGS. 1 and 2, the third piezoelectric material being used for transduction and positioned between the excitation electrodes and the ground plane 8 is only located under the electric excitation upper electrodes 54, 58, plumb with the latter, but not with each other. Such a structure may for example be obtained by etching a piezoelectric layer of a third material, deposited beforehand in a uniform way on the ground plane 8, by removal of the third material located between the upper electrodes 54, 58. The upper electrodes may if necessary be used as an etching mask.

Thus, the proposed solution improves the configuration of the field lines by structuring the piezoelectric transduction film so that the third piezoelectric material is strictly localized under the surface electrodes, on the other hand by placing the counter-electrode forming the ground plane 8 under the piezoelectric film, here discontinuous and patchy and setting it to electric ground as an electric reference so as to condition at best the electric field lines between the excitation electrodes.

During operation, the electric source 4 is here an alternating electric excitation differential voltage source, for example with a sign wave shape. The conducting ground plane 8 is brought to the ground electric reference and is thus used as an excitation phase reference.

The voltage delivered by the electric source 4 in opposition of phase between its output terminals 20, 22 excites in opposition of phase the pair of adjacent elementary electro-acoustic transducers 34, 38.

In FIG. 2, the voltage at a given instant being set to +V on the electrode 54 of the elementary transducer 34 of the first comb, the voltage set on the electrode 58 of the elementary transducer 38 of the second comb 36 is inverted and equal to −V.

The signal V oscillates over time at frequency ft.

Each resonator, formed by a single and different elementary transducer 34, 38, its associated upper electrode 54, 58, and the portion of the ground plane 8 located plumb with the upper electrode 54, 58, independently radiates some acoustic energy into the acoustic substrate 6.

However, because of the opposite phase of the radiated elastic waves and of the distance between the thereby formed acoustic sources, less than or equal to half a wavelength $\lambda$ of the surface wave of the substrate 6, the overall radiation of the surface towards the volume, i.e. in the reverse direction of the Z axis, is almost totally suppressed by destructive interferences of the elastic waves radiated by both sources.

The energy is thus confined at the surface and may propagate along the surface over a certain distance. Harmonic admittance calculations show that the losses associated with the propagation of the mode under the network are negligible with respect to the intrinsic losses (acoustic losses by the viscoelastic effect, dielectric losses) of the applied materials. Indeed, for guided modes under the network, the calculation of these losses indicate values notably less than 0.5 mdB ($0.5 \times 10^{-3}$ dB) per acoustic wavelength of the surface wave, i.e. much less than the losses induced by the radiation of a wave with elliptic polarization in the adjacent medium if the latter is air (radiation of the component normal to the surface, is quasi-zero in the case of shear waves and totally suppressed by encapsulating the component in vacuo).

Figure 3:
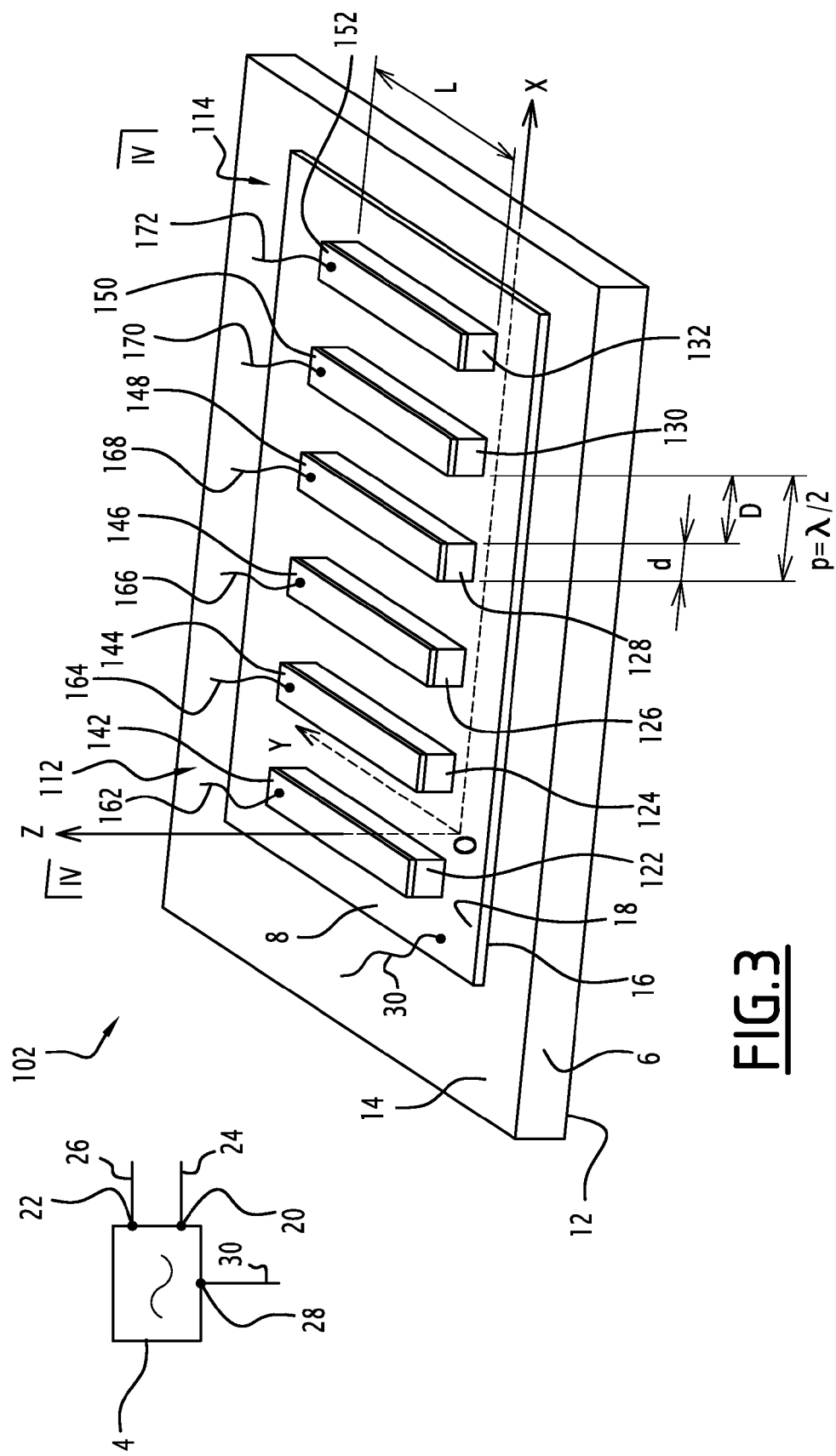
FIG. 3 is a perspective view of the structure of a second embodiment of a guided bulk wave transducer according to the invention.

According to FIG. 3 and to a second embodiment, an electro-acoustic transducer 102 with surface-guided elastic bulk waves, intended to operate at a predetermined acoustic wavelength $\lambda$, is connected like the transducer 2 described in FIGS. 1 and 2 to the same electric source 4, configured for operating for example here like a general electric excitation external source.

The electro-acoustic transducer 102 comprises like the transducer 2, the same acoustic substrate 6, the same electric ground plane 8, and a network 110 of synchronous acoustic excitation electro-acoustic elementary transducers.

The network 110 of elementary transducers for synchronous excitation and guidance of elastic bulk waves at the surface is here mechanically and electrically connected to the electric source 4 at the first input terminal 20 and the second input terminal 22 with opposite polarities through the corresponding first conducting wire 24 and the second conducting wire 26. The ground plane 8 is here mechanically and electrically connected to the electric excitation source 4 at the third input terminal 28 for electrically setting to a common ground the source 4 through the third conducting wire 30.

Figure 4:
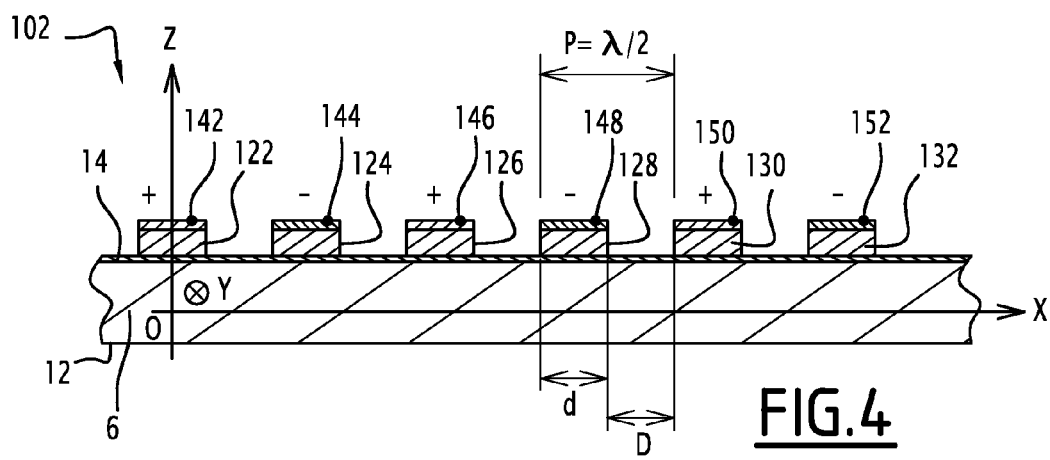
FIG. 4 is a section of the transducer described in FIG. 3 along the sectional plane IV-IV.

According to FIGS. 3 and 4, the network 110 includes a first comb 112 and a second comb 114 of several elementary piezoelectric transducers 122, 124, 126, 128, 130, 132.

The first comb 112 is here formed with three first elementary piezoelectric transducers, respectively designated by references 122, 126, 130, and laid out along a same first oriented direction.

The second comb 114 is here formed with three second elementary piezoelectric transducers, respectively designated by references 124, 128, 132, and of the same shape as the first elementary piezoelectric transducers 122, 126, 130 of the first comb 112.

The second elementary piezoelectric transducers 124, 128, 132 of the second comb are laid out along a second direction opposite to the first direction so that the first elementary piezoelectric transducers 122, 126, 130 of the first comb 112 and the second elementary piezoelectric transducers 124, 128, 132 of the second comb 36 are alternately interlaced two-by-two according to a periodic step p of the network and along the propagation direction of the elastic surface waves along the second supporting face 14 in the direction of the first length l1 of the acoustic substrate 6 represented by the direction of an axis X from left to right in FIGS. 3 and 4, the axis X forming the first axis of a reference system 139.

The reference system 139 comprises a point of origin designated by O, the first axis X, a second axis Y and a third axis Z.

The origin O is a point of the acoustic substrate 6 located below the second face 14 of the acoustic substrate 6 in a middle plane crossing the first elementary transducer 122 in its length L normal to the plane of FIG. 4, i.e. the sectional plane IV-IV of FIG. 3.

The third axis Z is the axis passing through O, oriented along the normal of the second face 14 of the acoustic substrate 6 and defines with the first axis X the sagittal plane of FIG. 4, i.e. the sectional plane IV-IV of FIG. 3.

The second axis Y is the axis of the reference system 39 which makes the (X, Y, Z) trihedron direct. Crossing the point O, it is illustrated upright in FIG. 4 escaping towards the rear.

The network step p is substantially equal to half the acoustic wavelength $\lambda$ of the surface-guided bulk wave along the acoustic substrate 6 or equivalently, double the network step 2*p* is substantially equal to the acoustic wavelength $\lambda$ of the surface-guided bulk wave of the acoustic substrate.

Each elementary transducer 122, 124, 126, 128, 130, 132 includes like the elementary transducers 34, 38 of the network 10 described in FIGS. 1 and 2, a single and different rod and a single and different excitation upper metal electrode 142, 144, 146, 148, 150, 152, of a same structure, of a same third material and with the same geometrical shape, i.e. of the same third thickness h, of the same third width d, and of the same third length L.

The upper electrodes 142, 146, 150 of the elementary transducers 122, 126, 130 of the first comb 112 are connected to the first terminal 20 of the electric source 4 through electric connections 162, 166, 170 put in common by the electric conductor 24.

The upper electrodes 144, 148, 152 of the elementary transducers 124, 128, 133 of the second comb 114 are connected to the second terminal 24 of the electric source 4 through electric connections 164, 168 172 put into common by the electric conductor 26, the electric polarity of the second terminal 24 being inverted relatively to that of the first terminal.

Like the elementary transducers 34, 38 of the network 10, the third material and the second cut are selected for allowing propagation of elastic bulk waves in the direction of the third thickness h with a high electromechanical coupling coefficient at least greater than or equal to 0.1%.

In practice, the minimum value of the electromechanical coefficient is equal to 5% in the case of applications to filters, is comprised between 0.1 and 1% in the case of applications to resonators for a stable frequency source with high spectral purity. In the case of applications to sensors, the minimum value may be defined between 0.1% and several tens of percent depending on the nature of the applied materials and on the targeted application.

The same third thickness h of each rod is comprised between one quarter and 1.1 times half the wavelength $\lambda_{bulk}$ of the elastic bulk mode propagating within the third material in the direction of the third thickness h and corresponding to the operating frequency ft.

The third width d is strictly less than half of the acoustic surface wavelength and has the same orientation as the propagation direction of the surface-guided bulk waves of the acoustic substrate 6.

Both elementary transducers 32, 36 are adjacent and separate from each other in the direction of their third width d by a separation space of a non zero separation length D, the sum of the third width d and of the separation length D being equal to the step p of the network.

In the second embodiment, by associating periodically several elementary piezoelectric transducers and by alternating the phase of their electric excitation, and by placing the electrode forming the ground plane 8 on the upper surface of the acoustic substrate 6 and in common underneath the local acoustic bulk wave sources, one then approaches a surface wave excitation structure.

The transducer may thus be assimilated to a SAW assembly of two interdigitated combs except for the difference that the piezoelectric material is strictly localized and concentrated under the excitation upper electrodes.

As the thickness h of the third piezoelectric material was selected so that the resonance frequency of each of these elementary transducers 122, 124, 126, 128, 130, 132 a priori identical by design, is less than the synchronism frequency of the transducer assembly 102 for which a wave is emitted into the acoustic substrate 6, commonly called an SSBW (surface skimming bulk wave) wave, and from which the surface can no longer behave like a guide, a structure is then formed for which the modal behavior gives the possibility of defining at least two particular operating conditions.

These operating conditions are directly related to the thickness of the piezoelectric layer and to the correspondence between the volume resonance and the surface mode in terms of resonance and synchronism frequencies. A first condition corresponds to waves having a low phase velocity as compared with that of the "natural" surface wave of the acoustic substrate. We then have piezoelectric layer thicknesses close to one quarter of the surface propagation wavelength. The preferred condition, the one giving rise to the highest coupling coefficients, corresponds to thickness layers close to half the surface propagation wavelength and of the volume resonance. Let us note that in all these cases, this thickness is optimized and the acoustic substrate is selected so that the phase velocity of the surface propagation is not greater than the SSBW velocity defined above, this so that the substrate actually ensures the role of a wave guide.

The elastic waves are localized in the substrate close to the surface and represent a surface mode. Depending on the orientation of the piezoelectric layer, the mechanical displacement in the resonators may be oriented in the sagittal plane (XOZ), or along the OY axis (transverse waves) or have the three components (generalized Rayleigh waves, also-called Sezawa waves).

In the preferred and discussed embodiment here, we assume that the main oscillation in the resonators has vertical polarization (a compression wave along OZ). Such vibrations exert a stress applied to the substrate $\sigma_{ZZ}$ and couple waves in the substrate with a displacement polarization similar to that of Rayleigh waves.

During operation, the electric source 4 is here an alternating electric excitation differential voltage, for example with a sine wave shape. The conducting ground plane 8 is brought to the electric ground reference and is thus used as an excitation phase reference.

The voltage delivered by the electric source 4 in opposition of phase between its output terminals 20, 22 excites in phase opposition the elementary transducers 122, 126, 130 of the first comb 112 and the elementary transducers 124, 128, 132 of the second comb 114.

In FIG. 4, the voltage at a given instant being set to +V on the electrodes 142, 146, 150 of the elementary transducers 122, 126, 130 of the first comb 112, the voltage set on the electrodes 144, 148, 152 of the elementary transducers 124, 128, 132 of the second comb 114 is inverted and equal to −V.

The signal V oscillates versus time at the frequency ft.

Each pair of resonators, formed by a single and different pair of elementary transducers (122, 124), (126, 128), (130, 132), an associated pair of upper electrodes, and the portion of the ground plane 8 located plumb with the upper electrode, independently radiates some acoustic energy into the substrate 6.

However, because of the opposite phase of the radiated elastic waves and of the distance between the acoustic sources of a same pair of thereby formed resonators, of less than or equal to half a wavelength $\lambda$ of the surface wave of the substrate, the overall radiation from the surface to the volume, i.e. in the reverse direction of the axis Z, is almost totally suppressed by destructive interferences of the elastic waves radiated by both sources of a same pair of resonators.

The energy is thus confined at the surface and may propagate along the surface of the substrate as bulk waves propagating within the elementary transducers formed as a network as described above and guided at the surface. The surface-guided bulk waves are all the more guided and sustained since the number of elementary transducer pairs is large.

Thus, the acoustic coupling between the surface mode and a resonance localized in the transducer rods and the electroacoustic coupling of the transducer 102 of FIG. 3 is larger than that shown by the transducer of FIG. 1.

Generally, the network comprises at least two piezoelectric transducers arranged in the form of two nested combs, and each comb from the first comb and the second comb comprises a same number of elementary transducers.

Preferably, the second crystallographic cut of the third material is selected so as to allow piezoelectric excitation of elastic bulk waves propagating in each elementary transducer in the direction of the third thickness h, these waves either being essentially longitudinal deformation waves or essentially transverse deformation waves.

Both embodiments described above give the possibility of combining the advantages of bulk wave components (strong coupling, high propagation velocity, high power resistance) without being forced to produce fragile structures like FBARs for example or self-suspended thin films, or to deposit thin layers with acoustic properties allowing the composition of a Bragg mirror.

However, this principle of deposition of thin layers having appropriate acoustic properties for composing a Bragg mirror may be utilized with the structures of the invention in order to in particular allow maximum electromechanical couplings, compatible with the specifications of modern radiofrequency filters, and for allowing notably high effective propagation velocities by utilizing harmonic conditions of a high order of the mirror (see for example patent FR 2 882 205-B1, 2007-06-22 entitled <<Dispositif à ondes acoustiques haute fréquence>> (high frequency acoustic wave device).

Preferably, the third thickness h of each elementary transducer is comprised either between 0.9 tims $\lambda_{bulk}/2$ and 1.1 times $\lambda_{bulk}/2$ or between 0.9 times $\lambda_{bulk}/4$ and 1.1 times $\lambda_{bulk}$ p/4, and adjusted so that a maximum resonance level is attained in each of the elementary transducers.

Preferably, the first material is comprised in the set formed by sapphire, diamond, silicon, YAG (yttrium-aluminium-garnet, so-called aluminous garnets) and other compounds based on garnets (iron-containing or chromium-containing garnets), fused quartz, crystalline quartz, lithium niobate, lithium tantalate, langasite and its variants, notably langanite and langatate, as well as gallium orthophosphate.

Preferably, the second material is comprised in the set formed by the metals Al, Mo, Pt, W, Cu, Ni, Au, Ag and the alloys AlCu, AlTi, AlSi, and Ti/Pt, Ta/Pt, and the third material is comprised in the set formed by aluminium nitride, aluminium nitride doped with scandium, zinc oxide, PZT, lithium niobate, lithium tantalate, crystalline quartz, langasite and its variants, gallium orthophosphate, potassium niobate and relaxers of the PMN-PT type and other variants of this nature.

Alternatively, the first material of the substrate is preferably quartz (either amorphous or crystalline), langasite and its variants, notably langanite and langatate, gallium orthophosphate so as to compensate for the frequency drift effects due to temperature observed for bulk waves generated by the elementary transducers and with a transverse polarization in the direction of the third length L.

Preferably, the length L of each elementary transducer is greater than ten times the acoustic wavelength $\lambda$ of the surface-guided bulk waves of the acoustic substrate.

Preferably, the repetition step p of the transducers is adjusted according to a surface wavelength characteristic of an elastic surface wave of the family comprising Rayleigh waves, Bleustein-Gulyaev waves (pure transverse shearing), STW waves, Sezawa waves, in order to allow effective excitation of the surface waves on an external surface area located outside and in the extension of the region of the network of the elementary transducers.

Preferably, the piezoelectric material film is preferably etched down to the underlying metal layer, forming the ground plane and on which said material has been deposited.

Preferably, the width of the upper electrodes and of the rods exactly coincide; this configuration being a priori the simplest to apply from a technological point of view.

Alternatively, each upper electrode itself structured may have a smaller width than that of its associated rod.

Alternatively, the electric source 4 is configured so as to operate as an electric receiver or both as a general electric excitation source and an electric receiver.

In the following and as an example, results of simulated performances of a transducer having the structure described in FIGS. 3 and 4 are shown.

In the simulation tool used for obtaining these results, the electrodes are assumed to be made in aluminium, the electro-acoustic transduction material is assumed to be in aluminium nitride, and the acoustic substrate is assumed to be in silicon or in sapphire.

By taking as an estimation of the Rayleigh wave velocity in silicon and sapphire, $V_{SAW} \sim 5{,}000$ m·s$^{-1}$, and the velocity of longitudinal waves in aluminium nitride AlN, $V_{AlN} \sim 11{,}000$ (±500) m·s$^{-1}$, for a working resonance frequency ft equal to 1 GHz, the following parameters give the possibility of promoting interaction between the surface mode of the substrate and a resonance localized in the rods of elementary transducers, considered as simple resonators arranged according to a periodic structure:

the period p of the network is equal to half the wavelength $\lambda$, i.e. 2.5 µm, with $$\lambda = \frac{V_{SAW}}{ft}$$

the metal thickness of the aluminium electrodes is comprised between 1,000-2,000 Å (not critical here)
the thickness h of the aluminium nitride layer is close to $\lambda_{bulk}/4$, i.e. 2.5 µm, or $\lambda_{bulk}/2$, i.e. 5.0 µm, with $$\lambda_{bulk} = \frac{V_{AlN}}{ft}.$$

A first case and a second case were simulated in order to compare the performances of a conventional transducer in which the transduction layer is solid, uniform and without any recess above the acoustic substrate and the performances of a transducer according to the invention as described in FIG. 3, wherein the transduction layer is a set of rods, each rod being located underneath a single and different electrode.

The first case is the case in which the height h of the aluminium nitride layer is close to $\lambda_{bulk}/4$, i.e. 2.5 µm.

The second case is the case in which the height h of the aluminium nitride layer is close to $\lambda_{bulk}/2$, i.e. 5 µm.

As the acoustic impedances of aluminium nitride and sapphire are approximately of the same magnitude, it may be assumed that a thickness of aluminium nitride equal to about $\lambda_{bulk}/2$ is more effective for exciting bulk waves than any other thickness, i.e. has an electromechanical coupling factor close to that of a self-suspended uniform wire of aluminium nitride for exciting bulk waves.

The voltage applied on the network of electrodes is symmetrical and observes the period of the structure (Bragg condition), which means that the solid aluminium electrode forming the ground plane deposited on the acoustic substrate and on which the piezoelectric rods are made is connected to a reference potential (0 Volt) and a phase alternation is applied on the excitation upper electrodes all along the structure.

Figure 5:
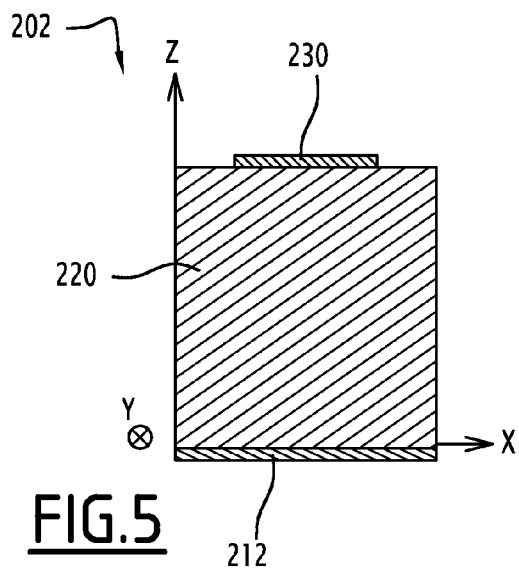
FIG. 5 is a view of a model of the structure of a conventional transduction elementary cell from the state of the art, wherein the piezoelectric layer is solid in terms of covering the acoustic substrate and consisting of aluminium nitride.

FIG. 5 illustrates the model of the architecture of an elementary cell 202 of a conventional transducer consisting of a bottom electrode 212 forming the ground plane, of a solid layer 220 of aluminium nitride, and of an excitation upper electrode 230. This elementary cell 202 is assumed to be repeated infinitely in the periodic structure forming the conventional transducer.

The layer forming the bottom electrode 212, made in aluminium and 100 nm thick, is deposited on the underlying acoustic substrate, not illustrated in FIG. 5 and simulated by boundary elements.

The excitation upper electrode 230 has the same thickness and is of the same nature as the bottom electrode 212.

The aluminium nitride layer 220 is oriented with its axis C normal to the propagation plane, radiation in silicon or sapphire being effected through the rear face of the bottom electrode downwards of FIG. 5, the side edges of the mesh being subject to periodic boundary conditions.

These periodic boundary conditions are obtained by formally establishing by means of equations, the spatial periodicity of the lattice by a representation, a so-called Floquet representation, of said periodic boundary conditions by a Fourier series to which is added the so-called Bloch function taking into account phase adjustments compatible with said spatial periodicity conditions. These periodic boundary conditions are also taken into account at the boundary elements via a periodic form of the Green function (acoustoelectric pulse response of the substrate). This model inter alia gives access to the harmonic admittance and impedance of the thereby simulated transducers, key parameters of their operation which are extracted (phase velocity, diffraction effects under the network, electromechanical coupling of the modes, propagation losses, etc). In particular, the modes which propagate under Bragg's condition are characterized by an input frequency and an output frequency of the stop band specific to any mode satisfying such conditions which, once they are determined, allow characterization of the diffraction effects (coefficient of reflection of the waves over the simulated period for example). A formal description of this model may be looked up in the article entitled <<Composants acoustiques utilisés pour le filtrage—Modèles et outils de simulation>> (acoustic components used for filtering—simulation models and tools) of Sylvain BALLANDRAS and William STEICHEN, published in the Techniques de l'Ingenieur, Reference E2001, Nov. 10, 2010.

Figure 6:
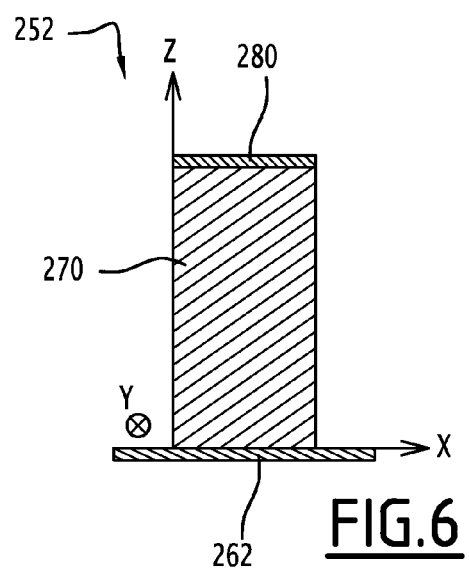
FIG. 6 is a view of a model of the structure of a transduction cell of the invention forming an elementary transducer of the surface-guided bulk wave transducer, in which the piezoelectric layer covering the acoustic substrate consists in aluminium nitride, and is limited and contained in the parallelepipedal portion located just below the associated excitation upper electrode.

FIG. 6 illustrates the model of the architecture of an elementary cell 252 of the transducer of the invention of FIG. 3 consisting of a bottom electrode 262 forming the ground plane, of an elementary transduction rod 270 in aluminium nitride, and an excitation upper electrode 280. This elementary cell 252 is assumed to be repeated infinitely in the periodic structure forming the transducer of the invention of FIG. 3.

The layer forming the bottom electrode 262, made in aluminium and 100 nm thick, is deposited on the underlying acoustic substrate, not illustrated in FIG. 6 and simulated by boundary elements.

The excitation upper electrode 280 is of a same thickness and of a same nature as the bottom electrode 262.

The aluminium nitride rod 270 is oriented with its axis C normal to the propagation plane, the radiation into silicon or sapphire being effected through the rear face of the bottom electrode downwards in FIG. 6, the side edges of the mesh being subject to the periodic boundary conditions described above.

Figure 7:
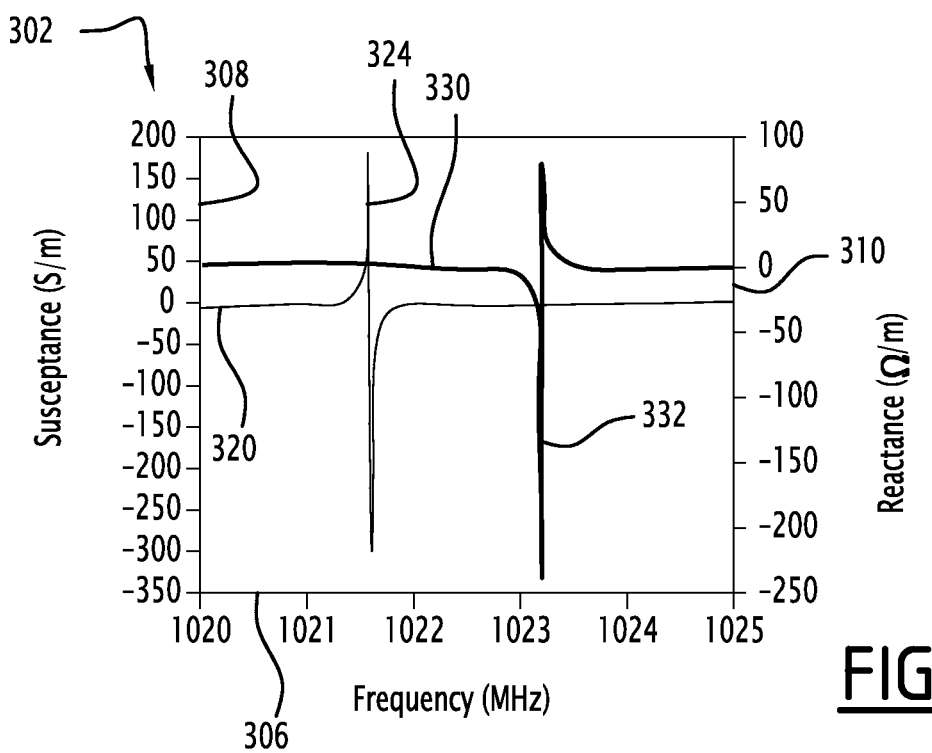
FIGS. 7 and 8 are views of the observed harmonic admittances and respectively corresponding to the models described in FIGS. 5 and 6 for an aluminium nitride thickness equal to 2.5 μm, and corresponding to the expected resonance modes.
Figure 8:
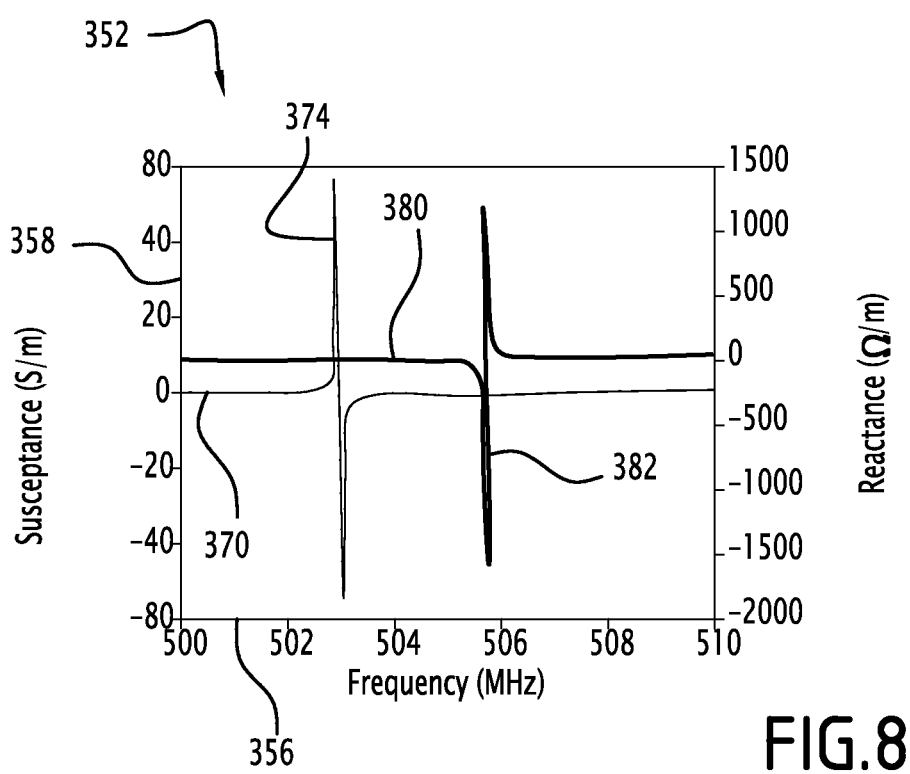

FIGS. 7 and 8 respectively represent simulation results in the first case, i.e. the case in which the height h of the aluminium nitride layer is close to $\lambda_{bulk}/4$, for a conventional transducer structure and the transducer structure of the invention.

The simulation results show that the resonance characteristics of the transducer structure of the invention of FIG. 3 radically differ from those of a conventional structure with a uniform piezoelectric layer.

The resonance characteristics of the transducers are illustrated in terms of the development of the harmonic admittance of "transducer" devices, calculated for one period and for 1 m of acoustic aperture.

According to FIG. 7, the resonance characteristics 302 of the conventional transducer structure are illustrated in a reference system having an axis of abscissae 306 of the excitation frequency ft, a first axis of ordinates 308, located on the left in FIG. 7, of the development of the harmonic susceptance expressed in Siemens per meter (S/m), and a second axis of ordinates 310, located on the right in FIG. 7, of development of the harmonic reactance expressed in Ohms per meter ($\Omega$/m). A pole in the mathematical sense of the term on these susceptance (imaginary part of the admittance) and reactance (imaginary part of the impedance) harmonic curves takes into account the existence of a real mode of the surface corresponding to loss-less wave propagation. The relative frequency distance between a pole of the admittance and the corresponding pole of the impedance takes into account the effectiveness of electromechanical coupling of the thereby characterized mode.

A first curve 320 which represents the development as a function of the frequency of the susceptance, i.e. the imaginary part of the admittance, includes a resonance 324.

A second curve 330 which represents the development as a function of the frequency of the reactance, i.e. the imaginary part of the impedance, includes an anti-resonance 332 corresponding to the resonance 324.

For the conventional structure with a uniform piezoelectric layer, it may be seen that the resonance corresponds to the excitation of the Rayleigh waves at a frequency close to 1 GHz as predicted.

According to FIG. 8, the resonance characteristics 352 of the transducer structure of the invention are represented in a reference system having an axis of abscissae 356 of the excitation frequency ft, a first axis of ordinates 358 for development of the susceptance, i.e. the imaginary part of the admittance, expressed in S/m and a second axis of ordinates 360 for development of the reactance, i.e. the imaginary part of the impedance, expressed in $\Omega$/m.

A first curve 370 which represents the development of the susceptance as a function of frequency includes a resonance 374.

A second curve 380 which represents the development of the reactance as a function of frequency includes an anti-resonance 382.

According to FIG. 8, for the structure of the invention, the Rayleigh waves are strongly slowed down by a mass excess load effect called <<mass loading>>, and the resonance is found at about 500 MHz. The coupling of the waves within the new structure is about 3.5 times greater than in the conventional case.

Figure 9:
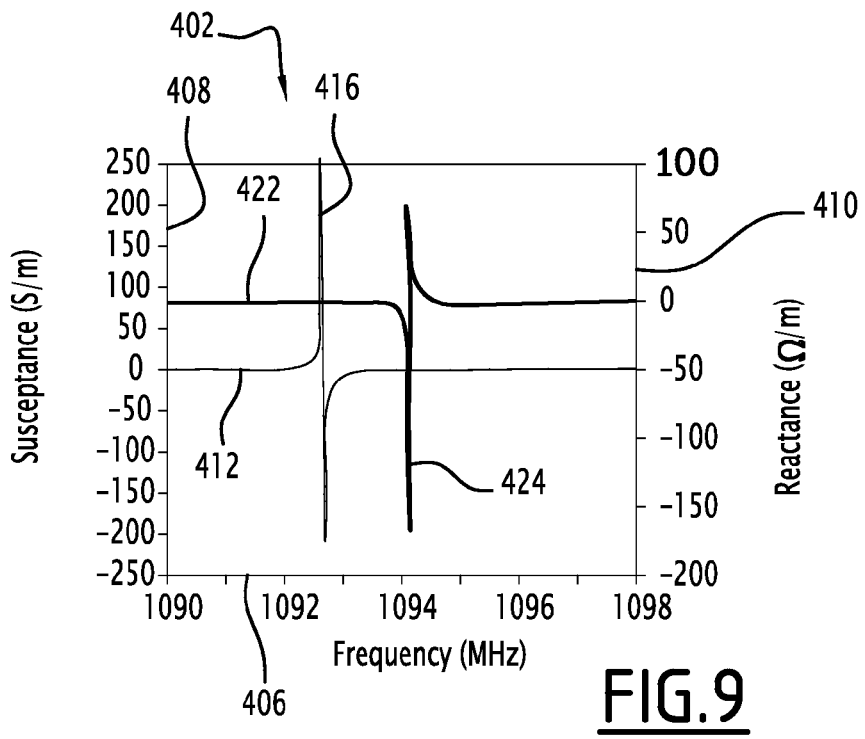
FIG. 9 is a view of the observed harmonic admittance corresponding to the model described in FIG. 5 for an aluminium nitride thickness equal to 5 μm, and corresponding to the expected resonance mode.
Figure 10:
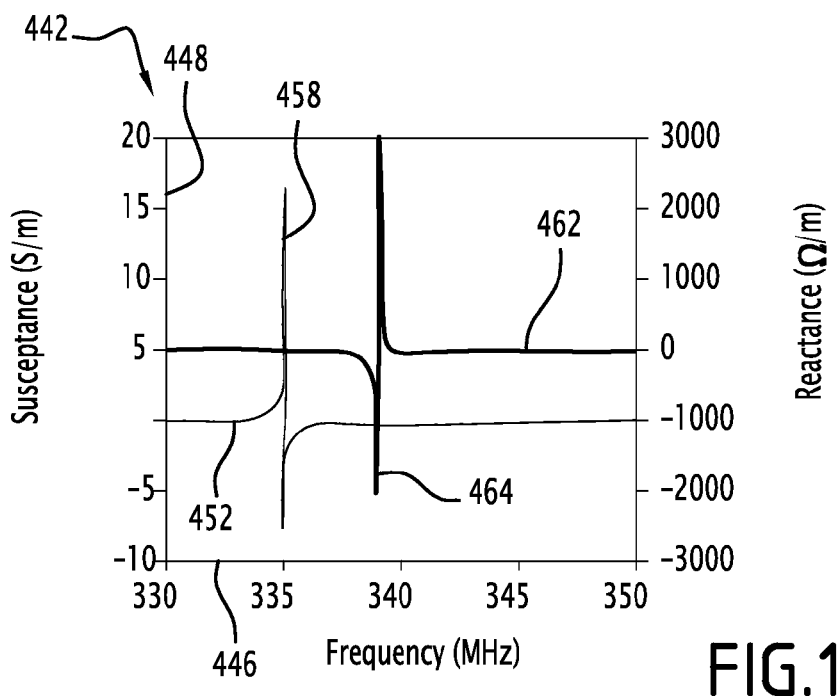
FIG. 10 is a view of the observed harmonic admittance corresponding to the model described in FIG. 6 for an aluminium nitride thickness equal to 5 μm, and corresponding to the expected resonance mode.
Figure 11:
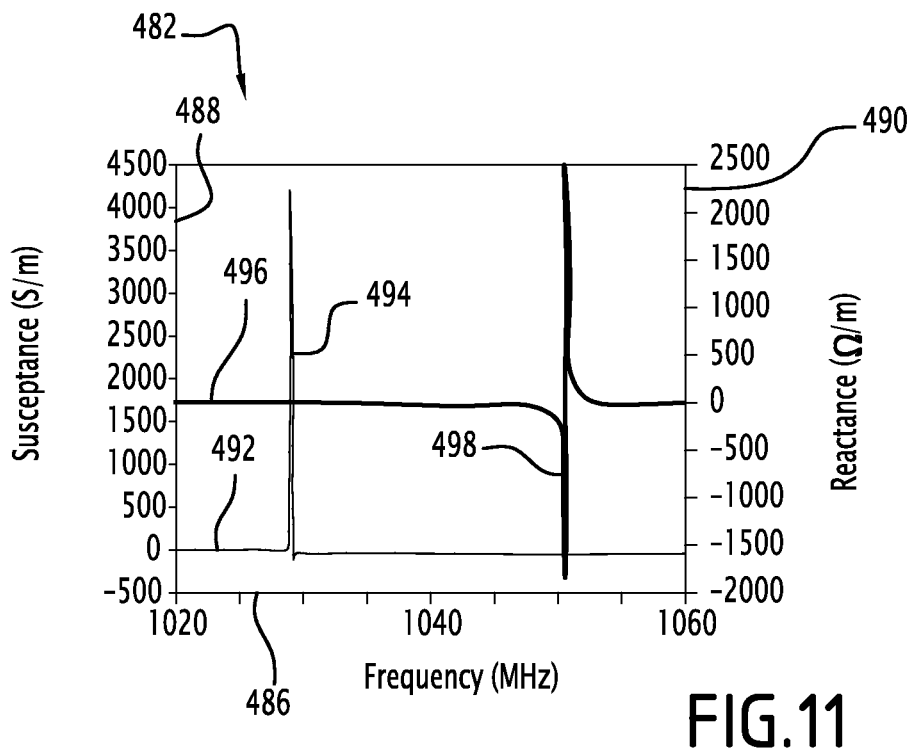
FIG. 11 is a view of the observed harmonic admittance corresponding to the model described in FIG. 6 for an aluminium nitride thickness equal to 5 μm, and corresponding to a second new resonance mode.

FIGS. 9, 10 and 11 respectively represent simulation results in the second case, i.e. the case in which the height h of the aluminium nitride layer is close to $\lambda_{bulk}/2$, for a first resonance mode of a conventional transducer structure, for a first and second resonance mode of a transducer structure of the invention.

The simulation results show that the resonance characteristics of the transducer structure of the invention of FIG. 3 radically differ from those of a conventional structure with a uniform piezoelectric layer.

The resonance characteristics of the transducers are represented in terms of development of the susceptance and of the reactance of <<transducer>> devices calculated for one period and for 1 m of acoustic aperture.

According to FIG. 9, the resonance characteristics 402 of the transducer structure of the invention are illustrated in a reference system having an axis of abscissae 406 for the variation of the excitation frequency ft, a first axis of ordinates 408, located on the left in FIG. 9 for development of the susceptance, i.e. the imaginary part of the admittance, expressed in S/m and a second axis of ordinates 410, located on the right of FIG. 9, of development of the reactance, i.e. the imaginary part of the impedance, expressed in $\Omega$/m.

A first curve 412 which represents the development of the susceptance as a function of frequency includes a first resonance 416.

A second curve 422 which represents the development of the reactance as a function of frequency includes a first anti-resonance 424 corresponding to the first resonance 416.

For the conventional structure with a uniform piezoelectric layer, it may be seen that the corresponding resonance to the excitation of Rayleigh waves has a frequency close to 1 GHz as predicted.

According to FIG. 10, the resonance characteristics 422 of the transducer structure of the invention are illustrated in a reference system for a first resonance mode corresponding to the first resonance mode of the conventional structure described in FIG. 9.

The reference system includes an axis of abscissae 446 for the excitation frequency ft, a first axis of ordinates 448 for development of the susceptance expressed in S/m and a second axis of ordinates 450 for development of the reactance expressed in Ω/m.

A first curve 452 which represents the development of the susceptance as a function of frequency includes a first resonance 458.

A second curve 462 which represents the development of the reactance as a function of frequency includes a first anti-resonance 464.

According to FIG. 10, for the structure of the invention, the Rayleigh waves are strongly slowed down by a mass excess overload effect called <<mass loading>>, and the resonance is found at about 350 MHz. The coupling of the waves within the new structure is of about 3.5 times greater than in the conventional case.

According to FIG. 11, the resonance characteristics 482 of the transducer structure of the invention are represented for a second resonance mode in a reference system having an axis of abscissae 486 for the excitation frequency ft, a first axis of ordinates 488 for development of the susceptance, i.e. the imaginary part of the admittance, expressed in S/m and a second axis of ordinates 490 for development of the reactance, i.e. the imaginary part of the impedance, expressed in Ω/m.

A first curve 492 which represents the development of the susceptance as a function of frequency includes a second resonance 494 corresponding to a second and novel mode.

A second curve 496 which represents the development of the reactance as a function of frequency includes a second anti-resonance 498 corresponding to the second resonance 494.

According to FIG. 11, the second resonance mode is a novel mode exhibited at 1 GHz in accordance with the longitudinal bulk wave in aluminium nitride.

Thus, if the resonance of the longitudinal bulk waves of the piezoelectric layer is found to be less than the bulk wave radiation threshold (here 1,130 MHz, corresponding to a transverse bulk wave velocity of 5,650 m·s$^{-1}$ in silicon), an additional mode occurs, having at least 10 times more electromechanical coupling than that of the mode guided on a uniform layer (4.0% in the case of FIG. 11, which may exceed 4.2% depending on the layer thickness, without any real advanced optimization effort).

Figure 12:
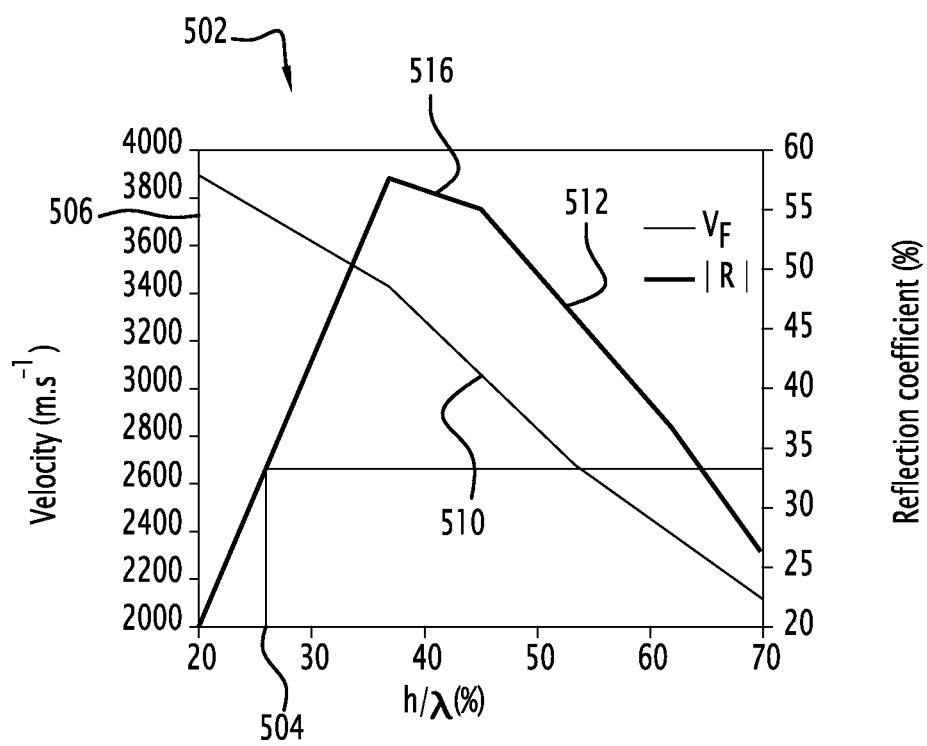
FIG. 12 is a view of the development of the velocity and reflectivity of the first resonance mode versus the normalized thickness of the rod.

According to FIG. 12, the development at a function of the height h of the standardized aluminium nitride rod by the wavelength of the surface mode of the characteristics 502 of the first resonance mode is illustrated in a reference system described hereafter. This reference system comprises an axis of abscissae 504 for the variation of the standardized height h by the wavelength λ of the surface mode, a first axis of ordinates 506 of the phase velocity of the surface mode elastic wave expressed in m/s, defined by the sum of the input and output frequencies of the stop band specific to the mode under Bragg's condition divided by two, and a second axis of ordinates 508 for the acoustic reflection coefficient of the surface mode wave at the input of an elementary cell proportional to the relative width of the stop band expressed as a percentage.

A first curve 510 represents the phase velocity of the elastic wave decreasing as a function of the thickness of the rod.

A second curve 512 represents the development of the reflection coefficient as a function of the thickness of the standardized rod.

The reflection coefficient exceeds 33% for a height h comprised between 25% and 60%.

Thus it appears that the first resonance mode of the rod structure still exists for these thicknesses and for larger thicknesses of aluminium nitride, greater than 5 μm, i.e. greater than the period p of the structure and has an electro-acoustic coupling exceeding 2%.

It should be noted that the surface mode of the transducer 102 does not correspond to a conventional surface wave but to a system of coupled FBAR resonators. Imposing a phase change by 180 degrees between close oscillators is equivalent to forcing the periodic structure to operate in its stop band.

Figure 13:
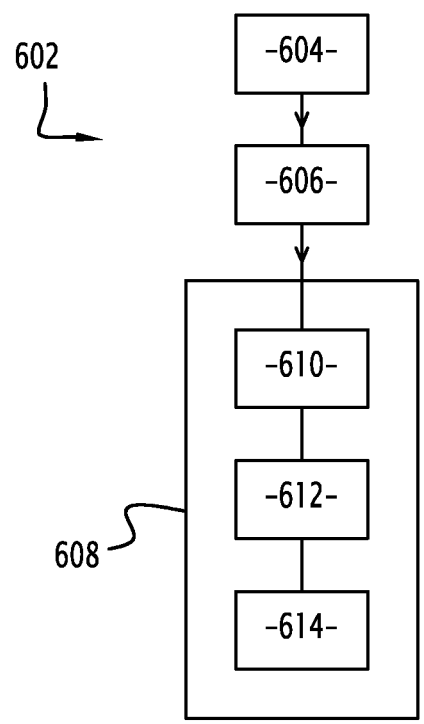
FIG. 13 is a flowchart of a method for manufacturing a surface-guided bulk wave transducer of FIGS. 1 to 4.

According to FIG. 13, a method 602 for manufacturing a surface-guided bulk wave transducer described in FIGS. 1 to 4 comprises a set of steps 604, 606, 608, 610, 612 and 614.

The transducer is intended to operate at an acoustic wavelength λ and to convert an electric signal at a working frequency corresponding to the acoustic wavelength λ into a surface-guided bulk wave and vice versa.

In the first step 604, an acoustic substrate is made in the form of a plate, forming a first layer in a first single crystal or polycrystalline electrically insulating material, cut along three planes of a first crystalline cut defined by a first angle φ, a second angle θ, and a third angle ψ defined by the nomenclature (YXwlt)/φ/θ/ψ of the IEEE Std-176 standard (1949 revision).

The plate is extended along a first thickness t1, a first length l1 and a first width w1, the plate of the acoustic substrate having a first rest face and facing it in the direction of the first thickness t1, a second opposite supporting face having a roughness condition.

The crystalline cut of the first material is selected and the roughness condition of the second face is sufficiently smooth so as to allow propagation of elastic Rayleigh or Bleustein-Gulyaev waves or pseudo surface waves (PSAW) in the direction of the first length l1 of the acoustic substrate.

In the following step 606, a ground plane is made as a second layer in a second electrically conducting material which is deposited on the acoustic substrate on the side of its second face.

The second layer is extended along a second uniform thickness t2, a second width w2, a second length l2, the second layer having a third face, positioned facing the second face of the acoustic substrate, and having a fourth opposite face and facing the third face in the direction of the second thickness t2, the directions of the second thickness e2, the second width w2, the second length l2 respectively being the same as the directions of the first thickness e1, the first width w1, the second length l2.

The second material is acoustically pervious to elastic waves generated by piezoelectricity.

In the following step 608 a network of synchronous acoustic excitation sources is produced by being positioned on the ground plane.

The network is configured so as to be mechanically and electrically connected to a synchronous excitation electric source, and comprises a first comb of one or several elementary piezoelectric transducers arranged along a first direction and a second comb of one or several elementary piezoelectric transducers arranged along a second direction opposite to the first so that the elementary piezoelectric transducers of the first comb and of the second comb are alternately interlaced two-by-two according to a periodic network step p and along the propagation direction of the elastic surface waves along the second supporting face in the direction of the first length l1 of the acoustic substrate.

The first comb and the second comb have the same number of elementary piezoelectric transducers.

Double the network step $2p$ is substantially equal to the acoustic wavelength $\lambda$;

Each elementary transducer includes a single and different rod and a single and different electric excitation metal upper electrode.

Each rod is made in a third single crystal or polycrystalline piezoelectric material, cut along three planes of a second crystalline cut defined according to the nomenclature (YXwlt)/$\phi$/$\theta$/$\psi$ of the IEEE Std-176 standard (1949 revision) by a second angle $\phi 2$, a second angle $\theta 2$, and a third angle $\psi 2$. Each rod has a same parallelepipedal shape defined by a third thickness h, a third width d, and a third length L, has a fifth face facing the face of the ground plane and a sixth face opposite to the fifth face and on which is deposited the associated excitation electrode.

The third material and the second cut are selected so as to allow propagation of elastic bulk waves in the direction of the third thickness h with a high coupling coefficient at least greater than or equal to 0.1%.

The third thickness h is comprised between one quarter and three quarters of the wavelength $\lambda_{bulk}$ of the acoustic bulk mode propagating within the third material in the direction of the third thickness h and corresponding to the operating frequency ft.

The third width d is strictly less than half the acoustic wavelength $\lambda$ of the surface mode and with the same orientation as the propagation direction of the surface-guided bulk waves of the acoustic substrate.

Two adjacent elementary transducers are separated from each other in the direction of their third width d by a separation space of a non-zero separation length D, the sum of the third width d and of the separation length D being equal to the network step p.

In a preferred embodiment, the step 608 for making the network of synchronous acoustic excitation sources successively comprises a step 610 for depositing a homogenous layer of the third piezoelectric material on the ground plane, a step 612 for depositing a homogenous metal layer on the homogenous layer of the third piezoelectric material, and a step 614 for etching a homogenous layer of the third material, and of the homogenous metal layer in order to form the elementary piezoelectric transducers of the excitation network.

The etching step 614 is carried out with a method comprised in the set formed by a chemical etching method, an etching method with irradiation of ions, and a mechanical sawing/polishing method. Alternatively, the etching method by irradiation of ions may integrate a chemical etching step in a gaseous phase, or even an alternation of ion bombardment and of chemical etching in a gaseous phase.

Alternatively, the network of excitation sources is manufactured by being separated beforehand from the ground plane and from the acoustic substrate, and then attached on the acoustic substrate through the ground plane by adhesive bonding, while observing the relative crystallographic orientations of the transducer rods and of the acoustic substrate.

Alternatively, a pure mode of transverse vibrations in the piezoelectric layer is allowed by selecting and adapted orientation of $LiNbO_3$ (a cut (YXl)/163° for example) or an AlN orientation with the "C" axis tilted with respect to normal of the production plane (of an angle of 45° for example), or with the C axis ideally in the propagation plane.

Alternatively, the use of substrates compensated for the temperature effects allows minimization of the frequency temperature coefficient (FTC) of the investigated mode. Also, a thin passivation layer on the upper electrode, or even inserted between one of the electrodes (i.e. the ground plane or the excitation upper electrode and the piezoelectric layer), provides a solution to this problem.

In another embodiment of the invention, thicker structures than those of FIG. 1 allow excitation of the harmonic modes potentially utilizable for various applications (sensors, sources) for which the necessity of spectral purity is less than for filters. Finer structures may also be envisioned for excitation of modes with high phase velocity, without however giving the possibility of attaining couplings as high as those accessible in the configurations described in FIGS. 1 to 4.

Figure 14:
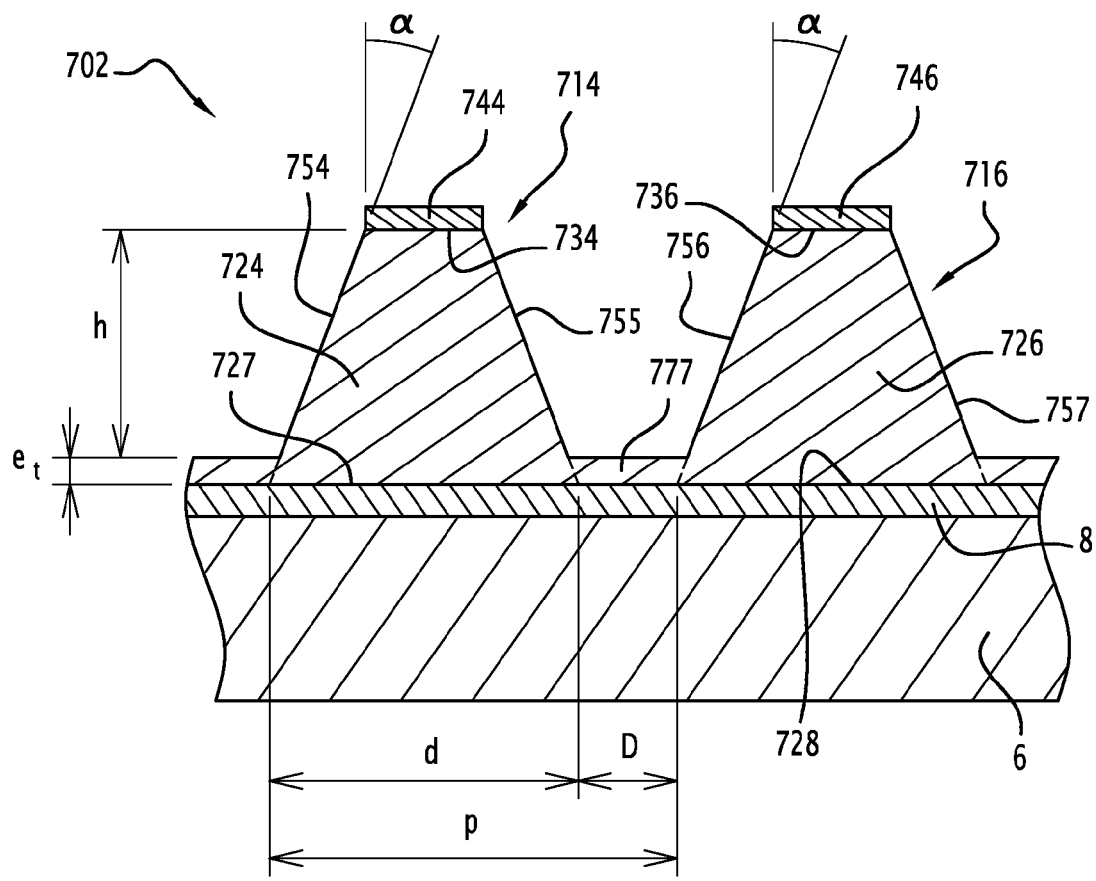
FIG. 14 is a partial sectional view of an alternative of the transducers of FIGS. 1 to 4 in which only two elementary transducers are illustrated.

As an alternative to FIGS. 1 to 4 and according to FIG. 14, a transducer 702, derived from the transducers 2 or 102 comprise at least two elementary transducers, two transducers 714 and 716 being only illustrated in FIG. 14.

The rod 724, 726 respectively associated with each elementary piezoelectric transducer 714, 716 has a same profiled shape of an ingot having a trapezoidal section.

Each rod 724, 226 includes a respective fifth face 727, 728 facing the face of the ground plane 8, a respective sixth face 734, 736, opposite to the corresponding fifth face 727, 728 and on which is deposited the associated excitation electrode 744, 746, and two side flanks 754, 755; 756, 757 connecting on both sides the fifth face 727; 728 and the sixth face 734; 736.

The third thickness h is defined as being the height separating the fifth face 727, 728 and the respectively associated sixth face 734, 736. The third width d for covering the ground plane 8 is defined as the width of the sixth face 727, 728. The third length L which cannot be illustrated in FIG. 14 is the extension length of each rod 724, 726.

The width of the sixth face 734, 736 is strictly less than the width of the sixth face 727, 728.

The clearance angle noted as a in FIG. 14 is the acute angle formed between the normal of the fifth face 734, 736 and the transverse direction of the left flank 754, 756 oriented in the same direction as the normal of the fifth face, i.e. the upper half-plane in FIG. 14.

It is assumed here that the clearance angle defined by the right flank 755, 757 has a value substantially identical with that of $\alpha$.

The clearance angle $\alpha$ is assumed here as the same for each rod.

In every case, the clearance angle is less than or equal to 30°.

This alternative notably thus includes the production of comb structures for which the imperfect leading etching angle is not perfectly orthogonal to the face of the ground plane.

Alternatively, and as illustrated in the example of FIG. 14, an interstitial layer 777, consisting in the same third material as the rods 724, 726, is deposited between the rods 724, 726 of the adjacent elementary transducers 714, 716. The thickness of the interstitial layer noted as $e_t$ should be less than the quarter of the third thickness h as defined above.

The interstitial layer 777 and the piezoelectric rods 724, 726 are in one piece when they are made by a method for etching an original layer in the third material.

The main application targeted by the invention relates to filters for civil, military and space telecommunications.

The invention may also target the manufacturing of resonant structures for oscillators as well as for sensors. The use of materials with a high refractory quality in particular allows high temperature applications (between 500 and 1000° C.) as explained below.

A secondary application relates to resonators with high quality factors for low noise frequency sources.

Another application of the invention relates to sensors with high compactness generally, more particularly temperature sensors in an extended range (from cryogenic temperatures to very high temperatures, which may range beyond 500° C. and potentially up to 1,000° C.), sensors of the accelerometer type, gyroscopic, gravimetric sensors capable of operating in liquid media (in particular the use of shear waves).

Advantageously, the invention gives the possibility of producing bulk wave resonators on wafers in a collective way but an original geometry for taking advantage of remarkable single crystal properties in terms of propagation velocities and minimization of losses intrinsic to the materials used. Particularly it lends itself to operating frequencies ranging from a few hundred MHz to several GHz. It allows connection modes between resonators which are particularly advantageous for filter structures with balanced port, but especially the use of bulk waves in structures with large coupling coefficients and quality of the resonance. The combination of such structures with layers of selected properties moreover allows optimization of the properties of the corresponding components, for example compensation for temperature effects with silica layers or with materials allowing excitation of shear waves in quartz, langasite (and its diverse variants), gallium orthophosphate and generally materials having a positive FTC of thereby excited waves. This is only one example of the possibilities provided by the invention which therefore gives the possibility of making original devices in a widely used frequency band for telecommunication and metrology applications.

The invention thus gives the possibility of solving the problem of manufacturing thin film acousto-electric resonators for radiofrequency applications.

Advantageously, the transducers with a network of rod transducers provide an advantageous alternative to the manufacturing of thin film structures which by definition are fragile. Indeed, these novel rod structures are firmly attached to the substrate and provide an element for controlling the operating frequencies by high resolution lithography, not accessible to the conventional bulk wave structures for which only the thickness of the film conditions the resonance.

What is claimed is:

1. A surface guided bulk wave transducer, intended to operate at an acoustic surface wavelength λ and to convert an electric signal at an operating frequency ft corresponding to the acoustic wavelength λ into a surface-guided bulk wave and vice versa, comprising an acoustic substrate and an electric ground plane, the acoustic substrate being made as a plate forming a first layer in a first single crystal or polycrystalline electrically insulating material cut along three planes of a first crystalline cut defined according to the nomenclature (YXwlt)/φ/θ/ψ of the IEEE Std-176 standard—1949 revision—by a first angle φ, a second angle θ, and a third angle ψ, the substrate plate being extended along a first thickness t1, a first length l1 and a first width w1, the plate of the acoustic substrate having a first rest face and facing, in the direction of the first thickness t1, a second opposite supporting face having a roughness condition, the crystalline cut of the first material being selected and the roughness condition of the second face being sufficiently smooth for allowing propagation of elastic Rayleigh, Bleustein-Gulyaev elastic waves or pseudo-surface waves, PSAW, in the direction of the first length l1 of the acoustic substrate, the ground plane being made as a second layer in a second electrically conducting material, deposited on the acoustic substrate on the side of its second face, the second layer being extended along a second uniform thickness t2, a second width w2, and a second length l2, the second layer having a third face, positioned facing the second face of the acoustic substrate, and having a fourth opposite face and facing the third face in the direction of the second thickness t2, the directions of the second thickness e2, the second width w2, the second length l2 respectively being the same as the directions of the first thickness e1, the first width w1, the second length l2;

wherein the surface-guided bulk wave transducer comprises a network of synchronous acoustic excitation sources, configured so as to be mechanically and electrically connected to a synchronous excitation electric source, deposited on the ground plane, and including a first comb of one or several elementary piezoelectric transducers arranged along a first direction and a second comb of one or several elementary piezoelectric transducers in the same number as those of the first comb arranged along a second direction opposite to the first so that the elementary piezoelectric transducers of the first comb and of the second comb are alternately interlaced two-by-two according to a periodic network step p and along the propagation direction of the elastic surface waves along the second supporting face in the direction of the first length l1 of the acoustic substrate, double the network step 2p being substantially equal to the acoustic wavelength λ;

each elementary transducer includes a single and different rod and a single and different electric excitation upper metal electrode, the rod being produced in a third single crystal or polycrystalline piezoelectric material, cut along three planes of a second crystalline cut defined according to the nomenclature (YXwlt)/φ/θ/ψ of the IEEE Std-176 standard—1949 revision—by a second angle φ2, a second angle θ2, and a third angle ψ2, having a same profiled shape with a rectangular or trapezoidal section, having a fifth face facing the face of the ground plane, a sixth face opposite to the fifth face on which is deposited the associated excitation electrode, and two side flanks connecting from both sides the fifth face and the sixth face, and defined by a third thickness h as being the height separating the fifth face and the sixth face, a third width d for covering the ground plane and a third length L;

the third material and the second cut being selected so as to allow propagation of elastic bulk waves in the direction of the third thickness h with a high coupling coefficient at least greater than or equal to 0.1%, and the third thickness h is comprised between a quarter and three quarters of the wavelength $\lambda_{bulk}$ of the elastic bulk mode propagating within the third material in the direction of the third thickness and corresponding to the operating frequency ft;

the third width d being strictly less than half the acoustic wavelength and with a same orientation as the propagation direction of the surface-guided bulk waves of the acoustic substrate;

two adjacent elementary transducers being separated from each other in the direction of their third width by a separation space of a non-zero separation length D, the sum of the third width d and of the separation length D being equal to the step p of the network, and the second material is acoustically pervious to elastic waves generated by piezoelectricity.

2. The surface-guided bulk wave transducer according to claim 1, wherein the first comb and the second comb each comprise a number of elementary transducers of more than two, preferably more than 5.

3. The surface-guided bulk wave transducer according to claim 1, wherein the second crystallographic cut of the second material is selected so as to allow piezoelectric excitation of elastic bulk waves propagating in each elementary transducer in the direction of the third thickness, these waves either being essentially longitudinal deformation waves, or essentially transverse deformation waves.

4. The transducer with a network of sources according to claim 1, wherein the third thickness h of each elementary transducer is either comprised between 0.9 times $\lambda_{bulk}/2$ and 1.1 times $\lambda_{bulk}/2$ or between 0.9 times $\lambda_{bulk}/4$ and 1.1 times $\lambda_{bulk}/4$, and adjusted so that a maximum resonance level is attained in each of the elementary transducers.

5. The surface-guided bulk wave transducer according to claim 1, wherein the first material is comprised in the set formed by sapphire, diamond, silicon, Yttrium-Aluminium-Garnet, YAG,—so-called aluminous garnets) and other compounds based on garnet, iron-containing or chromium-containing garnets, fused quartz, crystalline quartz, lithium niobate, lithium tantalate, langasite and its variants, notably langanite and langatate, as well as gallium orthophosphate, the second material is comprised in the set formed by the metals Al, Mo, Pt, W, Cu, Ni, Au, Ag and the alloys AlCu, AlTi, AlSi, and Ti/Pt, Ta/Pt, and the third material is comprised in the set formed by aluminium nitride, aluminium nitride doped with scandium, zinc oxide, PZT, lithium niobate, lithium tantalate, crystalline quartz, langasite and its variants, gallium orthophosphate, potassium niobate and relaxers of the PMN-PT type and other variants of this nature.

6. The surface-guided bulk wave transducer according to claim 1, wherein the first material of the acoustic substrate is preferably amorphous or crystallized quartz, langasite and its variants, notably langanite and langatate, gallium orthophosphate, lithium tetraborate, potassium niobate, lithium tantalate so as to compensate for the temperature drift effects observed for bulk waves generated by the elementary transducers and with a transverse polarization in the direction of the third length L.

7. The surface-guided bulk wave transducer according to claim 1, wherein the length L of each elementary transducer is greater than ten times the acoustic wavelength $\lambda$, of the surface-guided bulk waves of the acoustic substrate.

8. The transducer according to claim 1, wherein the repetition step p of the transducers is adjusted according to a surface wavelength characteristic of an elastic surface wave of the family comprising Rayleigh waves, Bleustein-Gulyaev waves, STW waves, Sezawa waves for allowing effective excitation of the surface waves on an external surface area located outside and in the extension of the region of the network of the elementary transducers.

9. The surface-guided bulk wave transducer according to claim 1, wherein either the ground plane, located between the adjacent elementary transducers is exposed, or a layer of a third material for which the thickness is less than a quarter of the third thickness h is deposited between the adjacent elementary transducers.

10. The surface-guided bulk wave transducer according to claim 1, wherein each elementary piezoelectric transducer comprises a layer of an acoustic material for compensating the frequency drift effects of temperature, interposed either between the piezoelectric rod and the ground plane, or between the piezoelectric rod and the associated excitation upper electrode, the temperature compensation material may for example be amorphous silica.

11. The surface-guided bulk wave transducer according to claim 1, wherein the rods have a same profiled shape with a trapezoidal section, and wherein for each rod, the clearance angle formed between the normal of the fifth face and a transverse direction oriented in the same direction as the normal is less than 30°.

12. A synchronously excited transducer utilizing surface-guided bulk waves having a predetermined acoustic wavelength comprising a transducer defined according to claim 1, and a differential voltage source having a first output terminal and a second output terminal, for which the applied voltage polarities are opposite to each other, the first output terminal being connected to the first comb and the second output terminal being connected to the second comb.

13. A method for manufacturing a surface-guided bulk wave transducer, intended to operate at an acoustic wavelength $\lambda$, and to convert an electric signal at a frequency corresponding to the acoustic wavelength $\lambda$, into a surface-guided bulk wave and vice versa, comprising the steps:

in a step, an acoustic substrate is produced as a plate forming a first layer in a first single crystal or polycrystalline electrically insulating material cut along three planes of a first crystalline cut defined according to the nomenclature (YXwlt)/$\phi$/$\theta$/$\psi$ of the IEEE Std-176 standard—1949 revision—by a first angle $\phi$, a second angle $\theta$, and a third angle $\psi$, the plate being extended along a first thickness t1, a first length l1 and a first width w1, the plate of the acoustic substrate having a first rest face and facing, in the direction of the first thickness t1, a second opposite supporting face having a roughness condition, the crystalline cut of the first material being selected and the roughness condition of the second face being sufficiently smooth for allowing propagation of elastic Rayleigh or Bleustein-Gulyaev waves or pseudo surface waves, PSAW, in the direction of the first length l1 of the acoustic substrate, and in a next step, a ground plane is produced as a second layer in a second electrically conducting material, deposited on the acoustic substrate on the side of its second face, the second layer being extended along a second uniform thickness t2, a second width w2, and a second length l2, the second layer having a third face, positioned facing the second face of the acoustic substrate, and having a fourth face opposite and facing the third face in the direction of the second thickness t2, the directions of the second thickness e2, the second width w2, the second length l2 respectively being the same as the directions of the first thickness e1, the first width w1, the second length l2, and the second material being acoustically pervious to elastic waves generated by piezoelectricity;

wherein the method further comprises a step consisting in that in a next step, a network of synchronous acoustic excitation sources is produced by being positioned on the ground plane, the network being configured so as to be mechanically and electrically connected to a synchronous excitation electric source, and including a first comb of one or several elementary piezoelectric transducers arranged along a first direction and a second comb of one or several elementary piezoelectric transducers in the same number as those of the first comb arranged along a second direction opposite to the first so that the elementary piezoelectric transducers of the first comb and of the second comb are alternately interlaced two-by-two according to a periodic network step p and along the propagation direction of the elastic surface waves along the second supporting face in the direction of the first length l1 of the acoustic substrate, double the network step 2p being substantially equal to the acoustic wavelength $\lambda$;

each elementary transducer including a single and different rod and a single and different excitation upper metal electrode, the rod being produced in a third single crystal or polycrystalline piezoelectric material, cut along three planes of a second crystalline cut defined according to the nomenclature (YXwlt)/$\phi$/$\theta$/$\psi$ of the IEEE Std-176 standard—1949 revision—by a second angle $\phi 2$, a second angle $\theta 2$, and a third angle $\psi 2$, having a same profiled shape with a rectangular or trapezoidal section, having a fifth face facing the face of the ground plane, a sixth face opposite to the fifth face on which is deposited the associated excitation electrode, and two side flanks connecting from both sides the fifth face and the sixth face, and defined by a third thickness h like the height separating the fifth face and the sixth face, a third width d for covering the ground plane and a third length L;

the third material and the second cut being selected so as to allow propagation of elastic bulk waves in the direction of the third thickness h with a high coupling coefficient at least greater than or equal to 0.1%, and the third thickness h being comprised between one quarter and three quarters of the wavelength $\lambda_{bulk}$ of the elastic bulk mode propagating within the third material in the direction of the third thickness h and corresponding to the operating frequency ft;

the third width d being strictly less than half of the acoustic wavelength and with the same orientation as the propagation direction of the surface-guided bulk waves of the acoustic substrate;

two adjacent elementary transducers being separated from each other in the direction of their third width by a separation space of a non-zero separation length D, the sum of the third width d and of the separation length D being equal to the step p of the network.

* * * * *